(12) United States Patent
Heilman

(10) Patent No.: US 11,360,146 B2
(45) Date of Patent: Jun. 14, 2022

(54) DIAGNOSTIC LIGHTING DEVICE

(71) Applicant: Exelon Generation Company, LLC, Kennett Square, PA (US)

(72) Inventor: David D. Heilman, Geneseo, IL (US)

(73) Assignee: Exelon Generation Company, LLC, Pennsylvania, PA (US)

( * ) Notice: Subject to any disclaimer, the term of this patent is extended or adjusted under 35 U.S.C. 154(b) by 173 days.

(21) Appl. No.: 16/588,435

(22) Filed: Sep. 30, 2019

(65) Prior Publication Data

US 2020/0103465 A1  Apr. 2, 2020

Related U.S. Application Data

(60) Provisional application No. 62/739,252, filed on Sep. 30, 2018.

(51) Int. Cl.
| | |
|---|---|
| *G01R 31/36* | (2020.01) |
| *G01R 31/367* | (2019.01) |
| *G01R 31/382* | (2019.01) |
| *G01R 31/392* | (2019.01) |
| *G01R 31/44* | (2020.01) |
| *G01R 31/387* | (2019.01) |
| *G01R 31/371* | (2019.01) |

(52) U.S. Cl.
CPC ....... *G01R 31/3648* (2013.01); *G01R 31/367* (2019.01); *G01R 31/3646* (2019.01); *G01R 31/371* (2019.01); *G01R 31/382* (2019.01); *G01R 31/387* (2019.01); *G01R 31/392* (2019.01); *G01R 31/44* (2013.01)

(58) Field of Classification Search
CPC .................................... G01R 31/3648
USPC ............................................ 702/63
See application file for complete search history.

(56) References Cited

U.S. PATENT DOCUMENTS

| | | | | |
|---|---|---|---|---|
| 2010/0327766 A1* | 12/2010 | Recker | ............... | H02J 50/20 362/20 |
| 2013/0063027 A1* | 3/2013 | Recker | ............... | H05B 45/357 315/86 |
| 2014/0320011 A1* | 10/2014 | Hegarty | ............... | H02J 9/062 315/86 |
| 2015/0130282 A1* | 5/2015 | Mishra | ............... | H05B 47/115 315/86 |

* cited by examiner

*Primary Examiner* — Ricky Go
(74) *Attorney, Agent, or Firm* — Ballard Spahr LLP

(57) ABSTRACT

Systems and methods for a lighting device are described. The lighting device can comprise a plurality of headlamps, a rechargeable battery, and a controller. The controller can be configured to perform one or more diagnostic tests.

20 Claims, 12 Drawing Sheets

DIAGNOSTIC LIGHTING DEVICE

CROSS REFERENCE TO RELATED PATENT APPLICATION

This application claims priority to U.S. Provisional Application No. 62/739,252 filed Sep. 30, 2018, which is herein incorporated by reference in its entirety.

BACKGROUND

Industrial emergency lighting devices are required under various loss of power situations, as well as in remote areas where no installed lighting exists. These emergency lighting devices are used to provide an illuminated path for safe egress during a loss of power, as well as providing light to areas to facilitate safe operation or perform emergency maintenance in industrial facilities to allow personnel to continue to safely work during various loss of power situations. For example, nuclear power plant installations are required to illuminate safe shutdown equipment and critical control panels, as well as provide adequate egress, for at least 8 hours during a loss of power event and are regulated under 10 C.F.R. Appendix R to Part 50. Thus, nuclear power plants are required to determine when an emergency lighting device has degraded to the point that the lighting device is no longer capable of providing light for at least 8 hours. However, nuclear power plants utilize hundreds of these emergency lighting devices and conducting the required conformance testing and associated maintenance on each lighting device individually is time consuming, resource extensive, and expensive. Other industries are required to maintain and test emergency lighting under National Fire Protection Association Code that further specify requirements and extensive testing to ensure regulatory compliance. These requirements and industrial shortcomings are addressed by the disclosure herein.

SUMMARY

It is to be understood that both the following general description and the following detailed description are exemplary and explanatory only and are not restrictive. Methods and systems for lighting devices are described. In an exemplary embodiment, an apparatus comprises a plurality of headlamps and a rechargeable battery configured to provide power to the plurality of headlamps. The apparatus also comprises a power cable configured to receive power from an external power source. The apparatus further comprises a recording device configured to capture at least one of still images or videos. Additionally, the apparatus comprises one or more sensors that are configured to determine one or more characteristics of an environment external to the apparatus. Also, the apparatus comprises a wireless transceiver configured to communicate via one or more wireless networks. Additionally, the apparatus comprises a controller configured to perform one or more diagnostic tests on the rechargeable battery to determine a state of health of the rechargeable battery.

In another exemplary embodiment, each apparatus utilizes an integrated computing device that provides self-diagnostic, as well as external environmental and security monitoring around each device. In addition, each lighting device can be configured to continuously monitor and record self-diagnostic health status, external environmental characteristics through sensors, and security surveillance. The diagnostic lighting device is configured to provide an alarm and/or a notification indicating the status of the lighting device via a display, as well transmit (e.g., via a wireless network) the alarm and/or notification to a computing device.

In an additional exemplary embodiment, a method comprises sending, by one or more lighting devices to a computing device, respective diagnostic information associated with each of the one or more lighting devices. The respective diagnostic information can include information relating to the lighting device health and/or functionality, information related to environmental conditions surrounding the lighting device, and/or surveillance and/or security information captured by the lighting device. The one or more lighting devices can comprise wireless transceivers configured to communicate via one or more wireless networks. The one or more lighting devices can communicate with the computing device via the one or more wireless networks. The computing device can be configured to monitor the one or more lighting devices and provide a notification associated with a status of the one or more lighting devices. For example, the computing device can remotely monitor the one or more lighting devices and can provide notifications associated with the state of health of the one or more lighting devices, as well as notifications relating to the environmental conditions and surveillance and/or security information captured by the one or more lighting devices. The computing device can be further configured to send a request to the one or more light devices to perform one or more diagnostic tests on one or more components of the one or more lighting devices. The request can be sent on demand or automatically. The one or more diagnostic tests can indicate information associated with the rechargeable battery, battery charging capabilities, light functionality, communication protocol status, power capabilities and overall device full functionality, fault determination, and maintenance surveillance. Additionally, the computing device can be configured to control the surveillance and/or security capabilities of the one or more lighting devices. Thus, the computing device can be configured to monitor and/or control one or more lighting devices located within an industrial and/or commercial facility.

In an additional exemplary embodiment, a method comprises sending, by a computing device to a plurality of lighting devices, a request to perform one or more diagnostic tests associated with a rechargeable battery. Each of the plurality of light devices comprises a respective rechargeable battery. The method further comprises receiving, by the computing device form one or more of the lighting devices, respective results of the one or more diagnostic tests. Also, the method comprises determining, by the computing device for each of the lighting devices, a respective state of health of a rechargeable battery associated with each of the one or more lighting devices. Additionally, the method comprises determining, by the computing device based on the respective state of health, one or more notifications.

Additional advantages will be set forth in part in the description which follows or can be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, show examples and together with the description, serve to explain the principles of the methods and systems.

DETAILED DESCRIPTION

Figure 1:
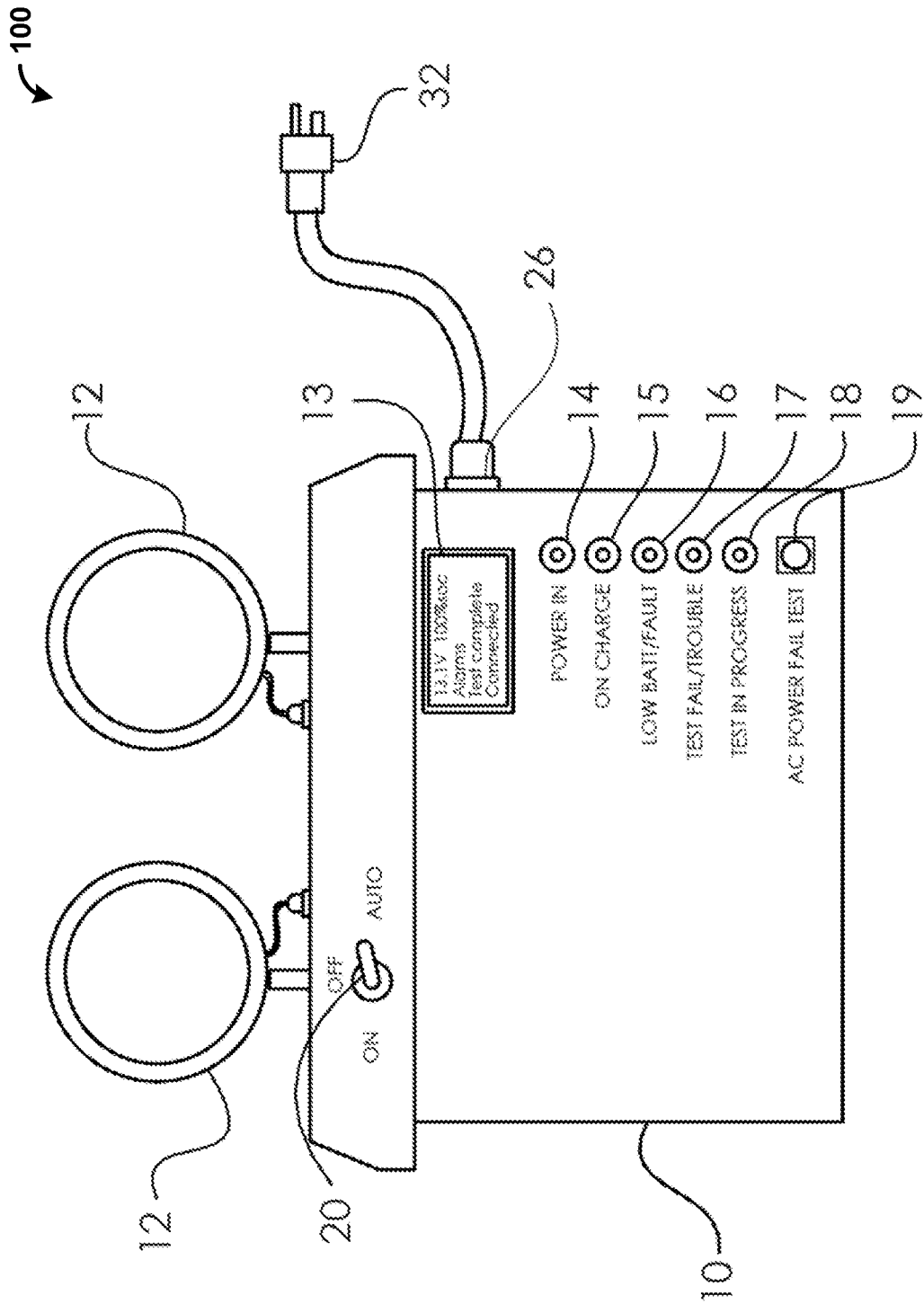
FIG. 1 illustrates an exemplary lighting device.

Before the present methods and systems are disclosed and described, it is to be understood that the methods and systems are not limited to specific methods, specific components, or to particular implementations. It is also to be understood that the terminology used herein is for the purpose of describing particular examples only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another example includes from the one particular value and/or to the other particular value. Similarly, when values are expressed as approximations, by use of the antecedent "about," it will be understood that the particular value forms another example. It will be further understood that the endpoints of each of the ranges are significant both in relation to the other endpoint, and independently of the other endpoint.

"Optional" or "optionally" means that the subsequently described event or circumstance may or may not occur, and that the description includes examples where said event or circumstance occurs and examples where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal example. "Such as" is not used in a restrictive sense, but for explanatory purposes.

Described herein are components that may be used to perform the described methods and systems. These and other components are described herein, and it is understood that when combinations, subsets, interactions, groups, etc. of these components are described that while specific reference of each various individual and collective combinations and permutation of these may not be explicitly described, each is specifically contemplated and described herein, for all methods and systems. This applies to all examples of this application including, but not limited to, steps in described methods. Thus, if there are a variety of additional steps that may be performed it is understood that each of these additional steps may be performed with any specific example or combination of examples of the described methods.

The present methods and systems may be understood more readily by reference to the following description of preferred examples and the examples included therein and to the Figures and their previous and following description.

The methods and systems are described below with reference to block diagrams and flowcharts of methods, systems, apparatuses and computer program products. It will be understood that each block of the block diagrams and flowcharts, and combinations of blocks in the block diagrams and flowcharts, respectively, may be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that may direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowcharts support combinations of means for performing the specified functions, combinations of steps for performing the specified functions and program instruction means for performing the specified functions. It will also be understood that each block of the block diagrams and flowcharts, and combinations of blocks in the block diagrams and flowcharts, may be implemented by special purpose hardware-based computer systems that perform the specified functions or steps, or combinations of special purpose hardware and computer instructions.

Described herein is a lighting device, as well as systems and methods associated with the lighting device. The lighting device as described herein can be portable or permanently affixed (e.g., not easily portable). In an exemplary mode, if AC input power to the lighting device fails, the lighting device automatically energizes one or more headlamps to provide illumination to an area. In another exemplary mode, the lighting device can be turned on by a switch on the lighting device or by remote commands from a computing devices. The lighting device comprises a wireless transceiver that is configured to communicate via one or more wireless network (e.g., Wi-Fi, Bluetooth, Near Field Communications (NFC), etc.). The wireless transceiver can communicate with a computing device and provide the computing device information related to battery health of the lighting device, as well as additional information associated with the lighting device.

The lighting device can be configured to perform one or more diagnostic tests on a battery of the lighting device. These tests can be scheduled to execute on a predetermined basis (e.g., at a predetermined interval such as hourly, daily, weekly, monthly, quarterly, yearly, etc.). The lighting device can store these results of these tests and/or provide the results of the tests to the computing devices. The results can be stored over a period of time. That is, multiple tests can be run at different times to keep track of the health status of the battery over a lifetime of the battery. A controller within the lighting device can be configured to control the lighting device, perform diagnostics on the lighting device, determine a state of charge of the battery, determine a state of health of the battery, a headlamp runtime, allow remote data gathering, and so forth. The lighting device can be configured to utilize a local display screen to inform a user as to a state of capacity, a state of health, a state of alarms, a state of connectivity, or any information related to the lighting device.

FIG. 1 illustrates an exemplary lighting device 100. Those skilled in the art will appreciate that digital equipment and/or analog equipment may be employed. One skilled in the art will appreciate that provided herein is a functional description and that the respective functions may be performed by software, hardware, or a combination of software and hardware.

The lighting device 100 can be portable or affixed to a structure. For example, the lighting device 100 can be affixed (e.g., installed) on a structure (e.g., a wall). The lighting device 100 comprises an enclosure 10. The enclosure 10 can be constructed out of metal, cast metal, fire resistant plastic, or any suitable material. In an aspect, the enclosure 10 acts as a heat sink for the lighting device 100 such that the enclosure 10 dissipates any heat generated within the enclosure 10. The enclosure 10 can contain all internal components of the light device 100, as well as providing a mounting surface for one or more external components. In an aspect, the enclosure 10 comprises an equalization vent membrane (not shown) that allows the enclosure 10 to be mechanically sealed while maintaining equalized internal pressure and external pressure. Stated differently, the equalization vent membrane enhances the ability of the enclosure 10 to withstand changes to external temperature and atmospheric pressure without damaging the enclosure 10 or damaging the mechanical seal. Additionally, the lighting device 100 can be configured to be water proof, fire resistant, resistant to chemical exposure, and so forth, such that the lighting device 100 can be utilized during an emergency situation. As an example, the lighting device 100 can be utilized during a fire, or a chemical spill, and continue to operate normally.

The lighting device 100 has a cable port 26 and a power cable 32. The cable port 26 can be configured to couple with any type of power cable 32. For example, if the lighting device 100 is permanently affixed to a structure, the cable port 26 can allow wiring associated with the structure to couple with the lighting device 100. Thus, in this example, the power cable 32 is wiring associated with the structure. In another example, the cable port 26 can be a quick cable release so that the power cable 32 can be quickly removed from the lighting device 100. Accordingly, the power cable 32 can be removed from the lighting device 100 to improve the portability of the lighting device 100. Additionally, the cable port 26 is a sealed port cut out of the enclosure 10 that couples the power cable 32 with one or more internal components of the lighting device 100. Thus, even with the power cable 32 removed from the cable port 26, the lighting device 100 is sealed to maintain the water proofing, fire proofing, and chemical resistance of the lighting device 100.

The power cable 32 can be coupled with an external power source to provide power to the lighting device 100. For example, the power cable 32 can be coupled to a wall outlet (e.g., 120 VAC, 240 VAC, 100 VAC to 300 VAC. etc.). As another example, the power cable 32 can be coupled to a portable power source such as a generator or portable battery pack. The lighting device 100 can utilize the power provided by the external power source via the power cable 32 to charge a battery associated with the lighting device 100, as well as run off the external power source. For example, when external power is available, the lighting device 100 can be configured to utilize the external power before utilizing any power stored within the lighting device 100 (e.g., by the battery). In exemplary embodiment, the lighting device 100 can illuminate the headlamps 12 via the external power, while simultaneously charging the battery.

The lighting device 100 has two headlamps 12 coupled to the enclosure 10. The headlamps 12 can be any light emitting device. That is, the headlamps 12 can be configured to receive power (e.g., from a power source) and configured to output light. For example, the headlamps 12 can be a light emitting diode (LED), an incandescent light emitting device, a fluorescent light emitting device, and so forth. The headlamps 12 can have any wattage and/or lumens output. Further, the headlamps 12 can be impact resistant and/or proof, water resistant and/or proof, and so forth. Additionally, the headlamps 12 can be variable output headlamps (e.g., dimmable). For example, the output of the headlamps 12 can be adjusted based on an area desired to be illuminated (e.g., brighter for a larger area), a desired operating time (e.g., reduce the output to increase run time of the headlamps 12), and so forth. While two headlamps 12 are described for ease of explanation, the portable light device 100 can have any number of headlamps (e.g., 1, 3, 5, 50, etc.).

The lighting device 100 can have a display 13. The display 13 can provide information relating to the status of the lighting device 100. For example, the display can indicate a voltage output of a rechargeable battery of the lighting device 100, a state of charge of the rechargeable battery, diagnostic test status, diagnostic test results, a state of health of the rechargeable batteries, a headlamp runtime, any errors or faults associated with the lighting device 100, wireless connectivity information, and so forth. The display 13 can be any display such as a liquid crystal display (LCD), an LED display, or any display.

The lighting device 100 can have one or more status indicators. The status indicators can be any component capable of indicating status such as a light (e.g., an LED). As shown, the lighting device 100 has a power in status indictor 14. The power in status indicator 14 indicates whether the lighting device 100 is receiving external power. Thus, the power in status indicator 14 indicates whether the lighting device 100 is charging the battery of the lighting device 100 or if the lighting device 100 is operating on the external power. The lighting device 100 has a on charge status indicator 15. The on charge status indicator 15 indicates whether the lighting device 100 is operating on the battery 11 of the lighting device 100. For example, the on charge status indicator 15 indicates if current supplied by the battery charger 24 is flowing into the battery 11 of the lighting device 100. As an example, a current greater than 100 mA flowing into the battery 11 can cause the on charge status indicator 15 to illuminate.

The lighting device 100 has a low battery and/or fault indicator 16. The low battery indicator 16 indicates whether the charge state of the battery of the lighting device 100 has reached a critical level. That is, the low battery indicator 16 indicates whether the lighting device 100 will imminently run out of power and/or that the lighting device 100 needs to be charged. The fault indicator 16 indicates if there is a fault with the lighting device 100. The fault indicator 16 can indicate any fault associated with the lighting device 100. For example, if the battery of the lighting device 100 fails, the fault indicator 16 may illuminate indicating the failure.

The lighting device 100 can have a test fail and/or trouble indicator 17. The test fail indicator 17 can indicate whether the lighting device 100 has failed a diagnostic test. For example, the lighting device 100 may run a diagnostic test to determine the state of health of the battery of the lighting device 100. If the battery fails the diagnostic test, the fail indicator 17 can illuminate to indicate the failure. As another example, the lighting device 100 can run a diagnostic test on a component of the lighting device 100 to determine a state of health of the component to ensure that the component is operating normally. The lighting device 100 can run a diagnostic test on all of the components of the lighting device 100, and can determine a respective state of health for each of the components. The diagnostic test can be an automatically scheduled diagnostic test or the diagnostic test can be performed on command. If a component of the lighting device 100 fails the diagnostic test, the test fail indicator 17 can indicate this failure. The trouble indicator 17 can indicate a problem or an operational parameter out of tolerance with the lighting device 100. For example, if any component of the lighting device 100 fails, the trouble indicator 17 can illuminate to indicate that a component of the lighting device 100 has failed. Various parameters and switch positions are continuously monitored and will indicate a trouble condition if any parameter is not as expected for a given mode of operation. Additionally, the lighting device 100 has a test in progress indicator 18 which indicates whether a diagnostic test is currently being run on the lighting device 100.

The lighting device 100 has an AC power fail test button 19. The AC power fail test button 19 can be a button that is capable of being actuated by a human to initiate the AC power fail test. For example, the AC power fail test can force the lighting device 100 to run off of battery power to ensure that the lighting device 100 is functioning normally upon a loss of external power.

The lighting device 100 has an operation switch 20. The operation switch 20 controls the operation of the lighting device 100. For example, the operation switch 20 controls the output of the headlamps 12. In an exemplary embodiment, the operation switch 20 has three distinct modes: OFF, ON, and AUTO. In the ON mode, the headlamps 12 output light regardless of the power source. In the OFF mode, the headlamps 12 do not output light regardless of the power source. In the AUTO mode, the headlamps 12 will output power if the lighting device 100 is operating on battery power or during a diagnostic test. Stated differently, the headlamps 12 will output light if power from the external power source is lost. Thus, in the AUTO mode, the lighting device 100 is capable of automatically causing the output of light via the headlamps 12.

Figure 2:
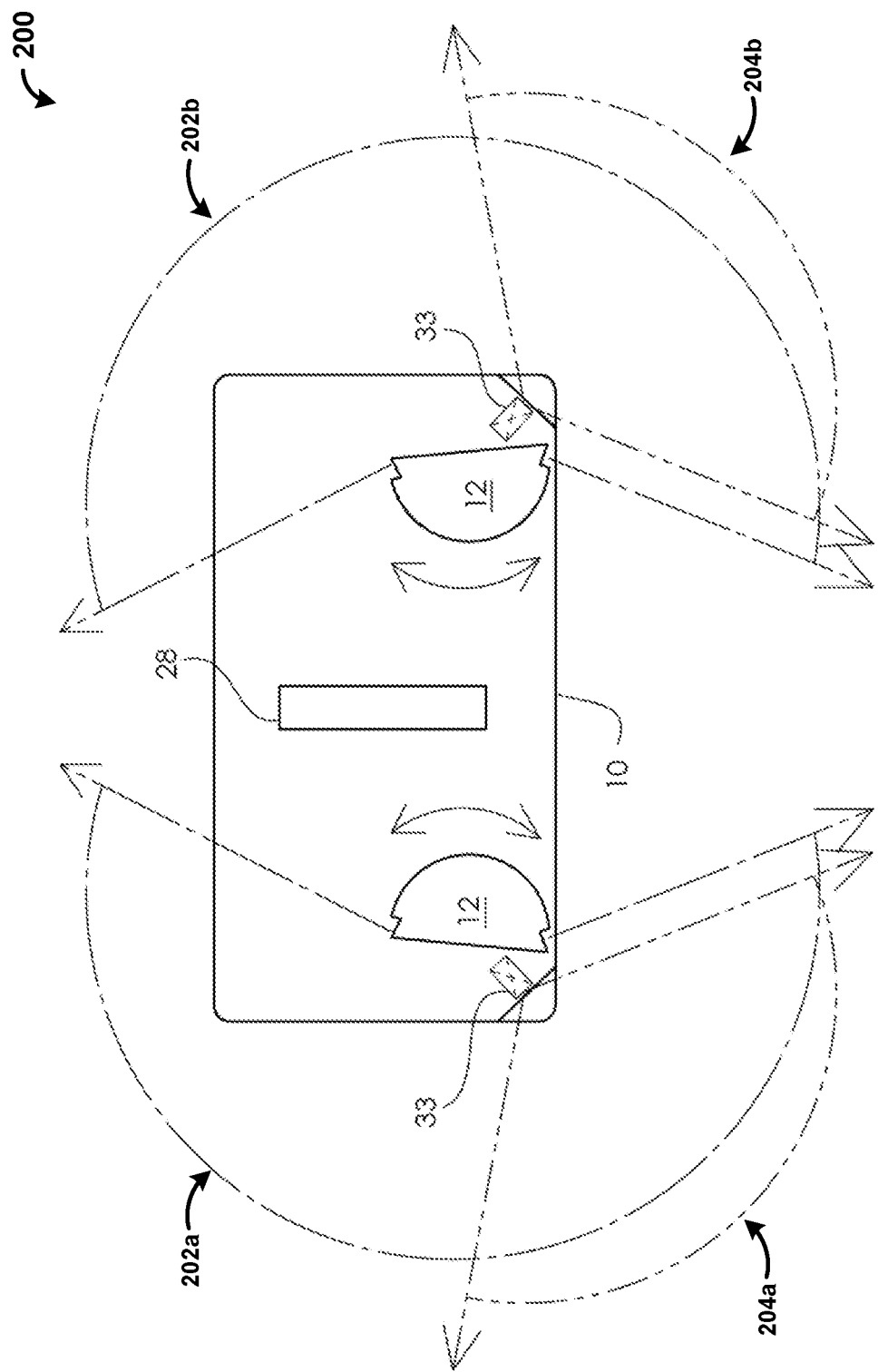
FIG. 2 illustrates a top view of an exemplary lighting device.

FIG. 2 illustrates a top view 200 of an exemplary lighting device. Specifically, the top view 200 is of the lighting device 100 of FIG. 1. As shown, the lighting device 100 has a handle 28 coupled to the enclosure 10 that allows the lighting device 100 to be transported. That is, the lighting device 100 shown in view 200 is a portable lighting device. However, the handle 28 is optional as a lighting device 100 affixed to a structure (e.g., a permanently installed lighting fixture) would not require the handle 28.

The top view 200 illustrates the angles of operation 202*a,b* of the headlamps 12. The headlamps 12 can be manually rotated (e.g., by a person operating the light device 100), or the headlamps 12 can be mechanical rotated. For example, the headlamps 12 can be coupled to an electromechanical device that is configured to rotate the headlamps 12 based on an input. The lighting device 100 can automatically provide an input to the electromechanical device to rotate the headlamps 12, or the lighting device 100 can receive an instructions to rotate the headlamps 12 from a computing device. While the angles of operation 202*a,b* of the headlamps 12 is shown to be approximately 270 degrees, the headlamps 12 can be configured to rotate 360 degrees or more and should not be limited to exemplary embodiment shown in the top view 200.

The top view 200 illustrates two cameras 33 coupled to the enclosure 10 of the lighting device 100. While two cameras 33 are shown for ease of explanation, the lighting device 100 can have any number of cameras 33 (e.g., 0, 1, 5, etc.). The top view 200 illustrates the angles of operation 204*a,b* of the cameras 33. The cameras 33 can be in a fixed position or the cameras 33 can be rotated. For example, the cameras 33 can be manually rotated (e.g., by a person operating the light device 100), or the cameras 33 can be mechanical rotated. For example, the cameras 33 can be coupled to an electromechanical device that is configured to rotate the cameras 33 based on an input. The lighting device 100 can automatically provide an input to the electromechanical device to rotate the cameras 33, or the lighting device 100 can receive an instructions to rotate the cameras 33 from a computing device.

The cameras 33 can be configured to capture still images or videos. For example, the lighting device 100 can be configured to operate the cameras 33 to capture the images or the videos. The lighting device 100 can provide the captured images or videos to a computing device. For example, the lighting device 100 can be placed in a location where security may be a concern (e.g., an external egress, an egress to a secure location, etc.) during a power loss event. The lighting device 100 can capture the images or videos via the camera 33 and provide them to a remote computing device such that the lighting device 100 operates as a security camera. Additionally, the lighting device 100 can be configured to determine motion within the angles of operation 204*a,b* of the cameras 33, and the lighting device 100 can provide a notification to the remote computing device indicating that the lighting device 100 detected motion. In this manner, the lighting device 100 can be configured to operate as a security camera, as well as a motion sensor to improve security during a loss of power event.

Figure 3:
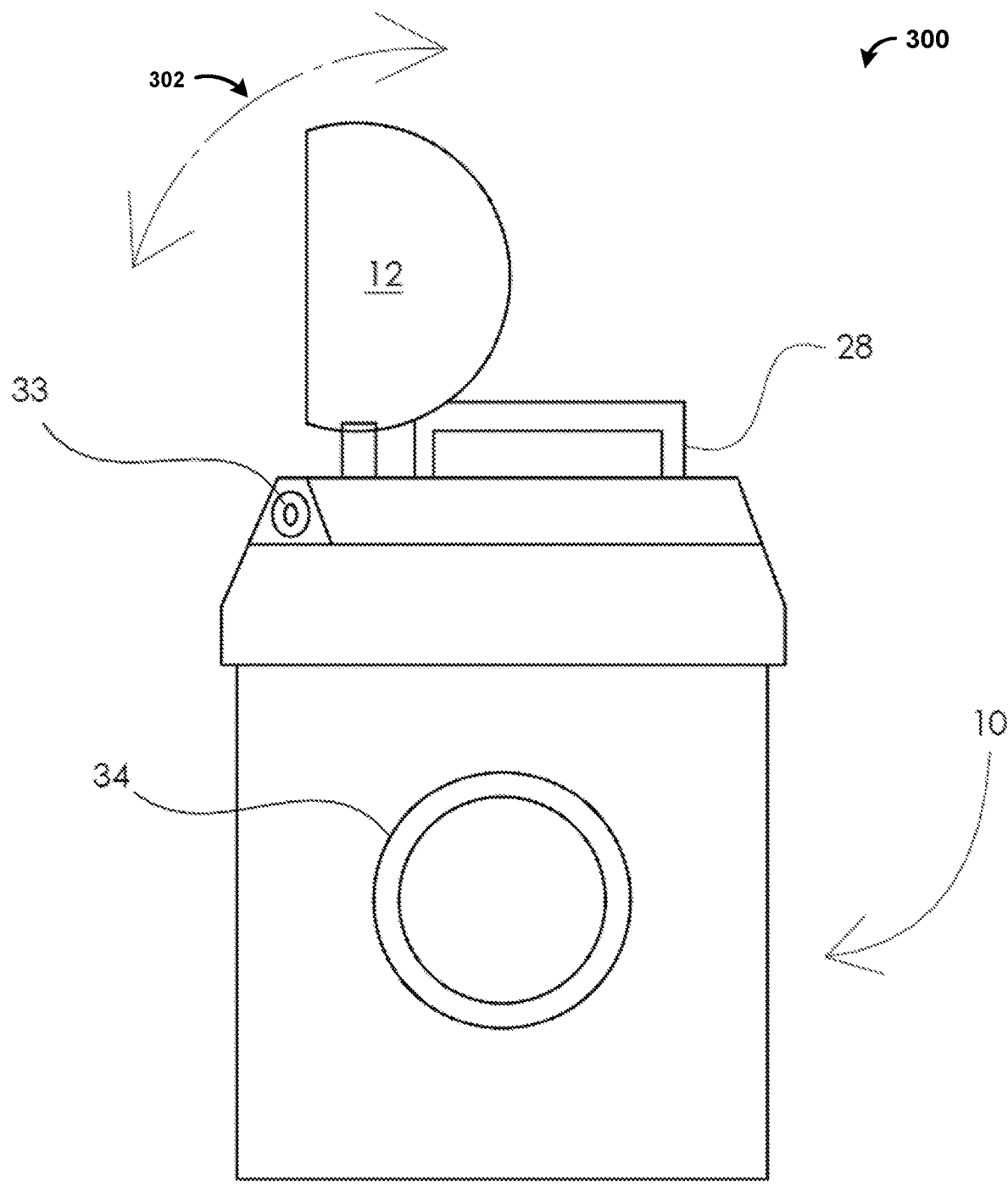
FIG. 3 illustrates a side view of an exemplary lighting device.

FIG. 3 illustrates a side view 300 of an exemplary lighting device. Specifically, the side view 300 is of the lighting device 100 of FIG. 1. The headlamps 12 are also configured to rotate vertically as shown by the angle of operation 302. The headlamps 12 can be configured to rotate from 0 degrees to 180 degrees vertically. Additionally, the lighting device 100 has a sensor 34. The sensor 34 can be one or more of a temperature sensor, a humidity sensor, a light sensor, a smoke sensor, a carbon monoxide sensor, a gas sensor, a chemical sensor, and/or a radiation sensor. While a single sensor 34 is shown for ease of explanation, the lighting device 100 can comprise any number of sensors configured to determine any number of characteristics of an environment external to the lighting device 100 (e.g., the environment around the lighting device 100, the ambient environment, etc.)

The lighting device 100 can be configured to utilize the sensor 34 to determine one or more characteristics of the environment external to the lighting device 100. For example, the lighting device 100 can receive data from the sensor 34, and the lighting device 100 can be configured to determine one or more characteristics of the environment based on the data. The lighting device 100 can be configured to provide data measured from the sensor 34 and/or the one or more determined characteristics to a computing device. As an example, the sensor 34 can be a temperature sensor, and the lighting device 100 can utilize the sensor 34 to monitor the external temperature. The lighting device 100 can be configured to provide the data from the temperature sensor to a computing device, and/or the lighting device 100 can send a notification to the computing device to indicate, based on the data received from the temperature sensor, that the external temperature has reached a threshold (e.g., that the temperature indicates a fire nearby. In this manner, the lighting device 100 can be configured to operate as a portable sensor device that can provide data from one or more sensors to the computing device.

Figure 4:
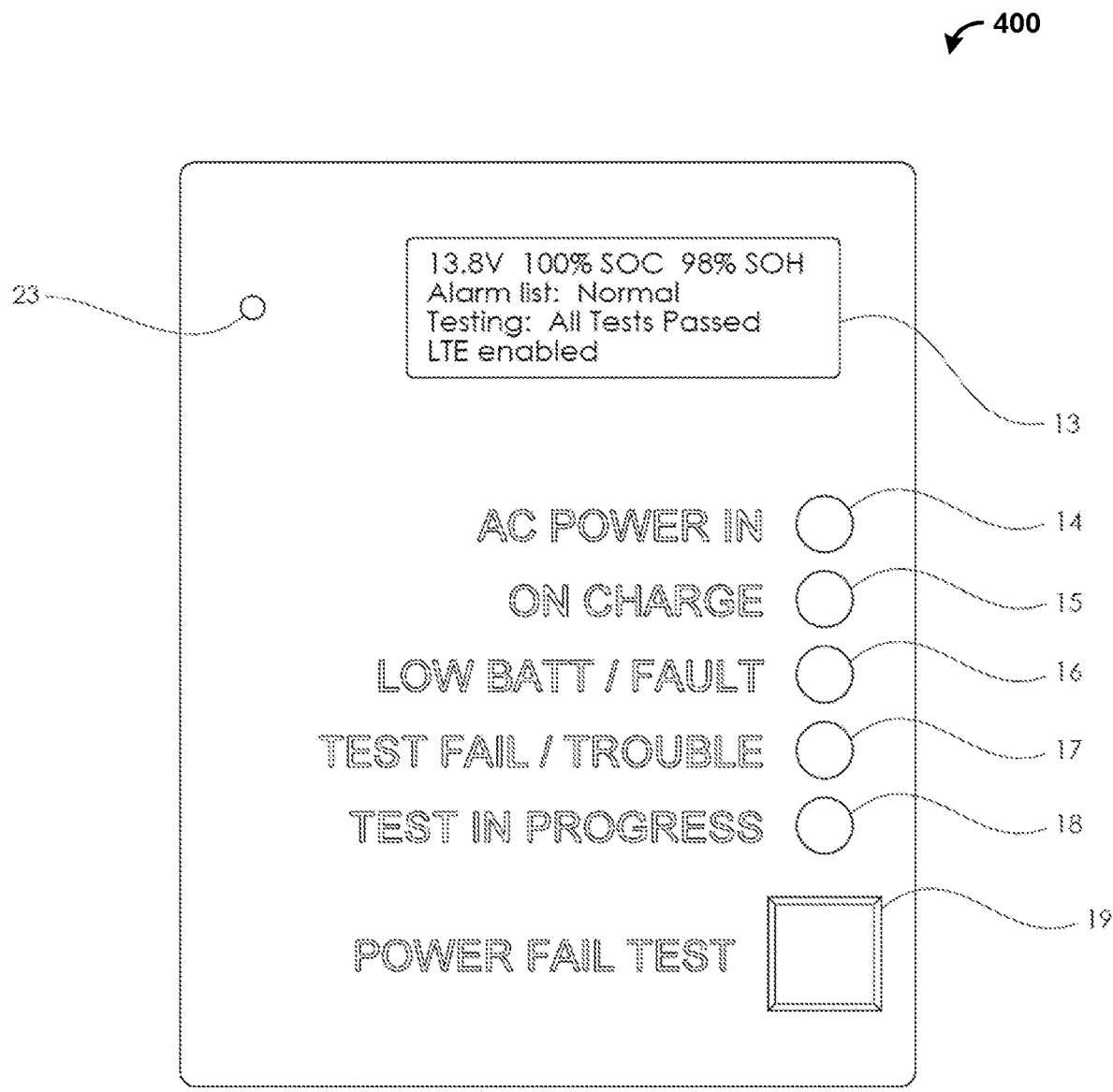
FIG. 4 illustrates an exemplary user interface for a lighting device.

FIG. 4 illustrates an exemplary user interface 400 for a lighting device. Specifically, the exemplary user interface 400 is an enlarged view of the display 13, the power in status indicator 14, the on charge status indicator 15, the low battery and/or fault indicator 16, the test fail and/or trouble indicator 17, the test in progress indicator 18, and the power fail test button 19 of the lighting device 100 of FIG. 1. Additionally, the lighting device 100 comprises a photocell 23 as shown in FIG. 4. The photocell 23 can be configured to determine luminous flux, foot candles, or any measure of light. The photocell 23 can be configured to detect an ambient light external to the lighting device 100. For example, if lights within a room are damaged so that the room is dark, but the lighting device 100 is continuing to receive AC power from an external power source, the lighting device 100 may not cause the headlamps 12 to output light. However, the lighting device 100 can be configured to utilize the photocell 23 to determine if the ambient light has dropped to a sufficiently low level that the lighting device 100 should cause the headlamps 12 to output light. Additionally, the lighting device 100 can be configured to ignore the measurement of the photocell 23 based on an outside indicator. For example, the lighting device 100 can determine that a light switch has been turned off, which does not involve an emergency event. Thus, the lighting device 100 can determine to not output light via the headlamps 12 even though the photocell 23 indicates that the room is dark.

Figure 5:
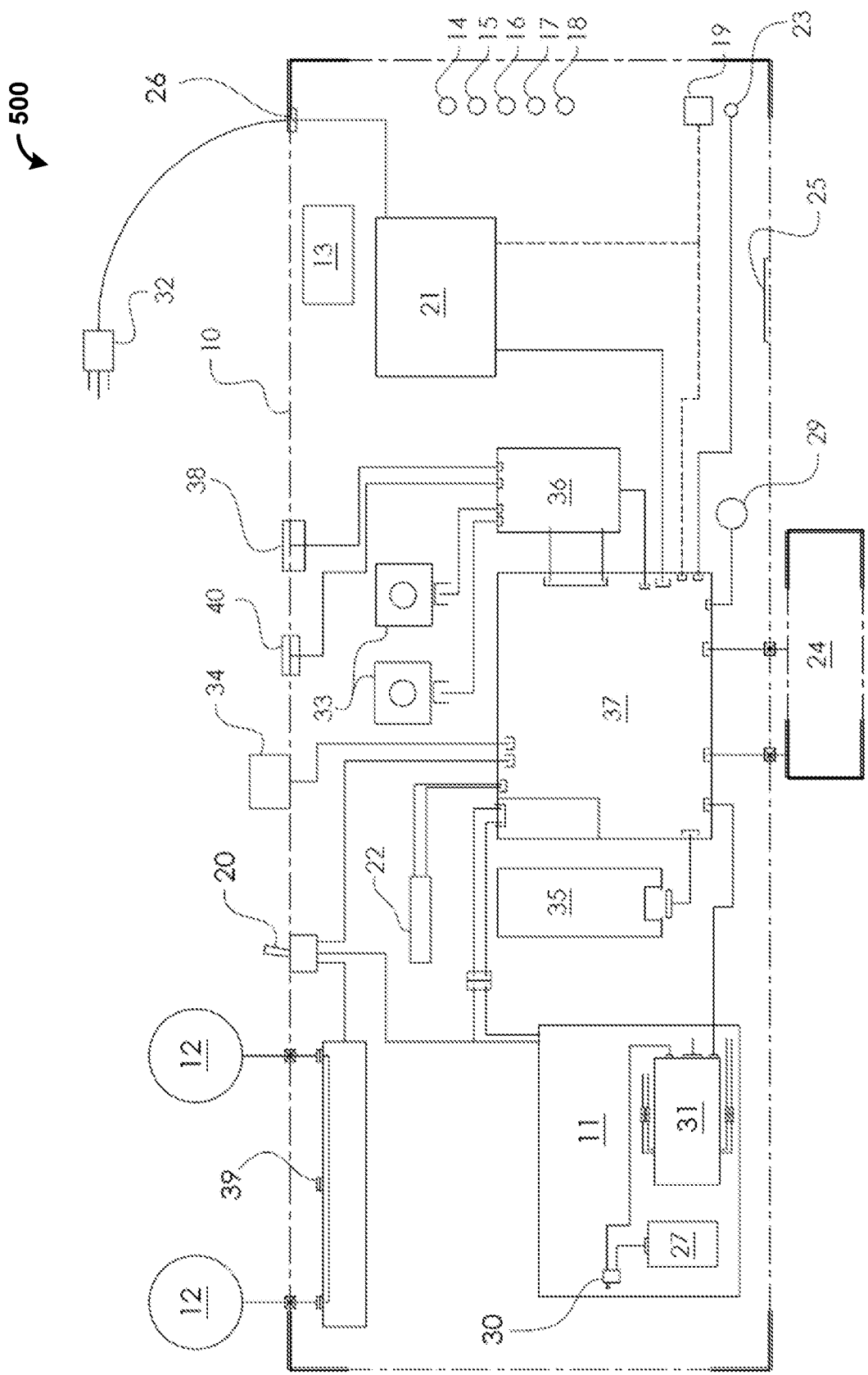
FIG. 5 illustrates an exemplary block diagram of a lighting device.

FIG. 5 illustrates an exemplary block diagram 500 of a lighting device. Specifically, the block diagram 500 illustrates an exemplary embodiment of the lighting device 100 of FIG. 1. As shown, a main AC test relay 21 is coupled to the power cable 32. The main AC test relay 21 is configured to receive AC power via an external power source, and provide the received AC power to a first processor board 37 and a battery charger 24. The main AC test relay 21 is configured to perform an AC power fail test upon the AC power fail test button 19 being actuated. The AC power fail test simulates a loss of AC power (e.g., from the external power source). For example, the main AC test relay 21 can disconnect (e.g., open one or more contacts) from the external power source to simulate the loss of AC power. If the lighting device 100 is set to the AUTO operation state, the headlamps 12 should automatically illuminate.

The enclosure 10 comprises an equalization vent membrane 25 that allows the enclosure 10 to be mechanically sealed while maintaining equalized internal pressure and external pressure. Stated differently, the equalization vent membrane 25 enhances the ability of the enclosure 10 to withstand changes to external temperature and atmospheric pressure without damaging the enclosure 10 or damaging the mechanical seal. Additionally, the lighting device 100 comprises an extra headlamp jack 39. The extra headlamp jack 39 allows an additional headlamp 12 to be coupled to the lighting device 100. Further, an external lamp circuit (e.g., a circuit comprising one or more lamps a distance away from the lighting device 100) can be coupled to the extra headlamp jack 39.

The battery charger 24 is configured to receive power from the external power source and provide the received power to a battery 11 (e.g., a rechargeable battery). The battery charger 24 can detect a state of charge of the battery 11 and can automatically stop charging the battery 11 upon the state of charge satisfying a threshold (e.g., that the battery 11 is fully charged). In an exemplary embodiment, the battery charger 24 is located in a separate sealed compartment adjacent to the enclosure 10. By having the battery charger 24 in the separate compartment from the rest of the components of the lighting device 100, less heat is produced within the enclosure 10, which can extend the life of the components of the lighting device 100. Additionally, separate compartment can improve the heat dissipation for the battery charger 24 to reduce the likelihood that the battery charger 24 overheats.

The battery 11 can comprise a wireless communication module 27. In exemplary embodiment, the wireless communication module 27 comprise a Bluetooth transceiver. The battery 11 can transmit one or more characteristics of the battery 11 via the wireless communication module 27. For example, the battery 11 can provide data related to charge cycles, battery cell health, voltage, etc. to a computing device. Additionally, the wireless communication module 27 can be coupled to a wireless communication control switch 30 that can activate and/or deactivate the wireless communication module 27.

The low battery and/or fault indicator 16 can be driven by a low battery voltage monitor circuit. The low battery and/or fault indicator 16 can be configured based on the battery 11 to prevent over discharge of the battery 11. For example, different batteries have different over discharge points so the low battery and/or fault indicator 16 can be configured to indicate the low battery level based on the specific make and/or type of the battery 11. During a low battery voltage detection during a loss of external power, the output of the headlamps 12 is terminated to preserve the remaining charge in the battery 11. Additionally, a tone generator 29 will output an audible tone to indicate to personnel in the vicinity around the lighting device 100 that the charge of the battery 11 has dropped below a predetermined threshold (e.g., a minimum state of charge of the battery 11). Further, upon the predetermined threshold being satisfied, the remaining charge in the battery 11 can be sufficient to allow the first processor board 37 to continue to operate for several days due to the low power requirements of the first processor board 37 as compared to the headlamps 12.

The first processor board 37 can comprise one or more processors. The first processor board 37 can be configured to handle the majority of the operations of the lighting device 100. For example, the first processor board 37 is configured to handle the operation of all of primary safety functions of the lighting device 100. For example, the first processor board 37 is configured to control operation of the headlamps 12 based on the state of charge of the battery 11, as well as the status of the external power source. As an example, the first processor board 37 can be coupled to a battery management system 31 that is configured to monitor, as well as store, circuit and battery parameters of the battery 11. The battery management system 31 can be configured provide a drain rate of the battery 11, as well as a charge rate of the battery 11. For example, the first processor board 37 can be configured to periodically perform partial discharge testing drain of the battery via the battery management system 31. The first processor board 37 can provide the results of the testing to the second processor board 36, which is configured to store the data.

Additionally, the first processor board 37 can be configured to determine and/or set the voltage of the battery 11 and/or the state of charge of the battery to any desired value. For example, the first processor board 37 can utilize the battery charger 24, in tandem with the battery management system 31, to set a value for the voltage and/or state of charge for the battery 11. The first processor board 37 can modify the value for the voltage and/or the state of charge for the battery 11 based on a temperature of the battery 11. For example, in areas of high ambient temperature, the state of charge is lowered to improve the longevity of the battery 11. For example, the state of charge may be maintained at 95-98%.

As shown, the first processor board 37 is separate from the second processor board 36. The second processor board 36 can be configured to handle all the secondary functions of the lighting device 100. That is, the second processor board 36 is configured to control the sensors 34, the cameras 33, as well communicate wireless with a computing device via a wireless transceiver 35. The wireless transceiver 35 can be configured to communicate via one or more wireless networks (e.g., Wi-Fi, Bluetooth, cellular, satellite, etc.) By separating the first processor board 37 from the second processor board 36, an additional layer of security and/or redundancy can be achieved. For example, if malicious software and/or firmware is sent to the lighting device 100, the second processor board 36 will process the malicious software and/or firmware and be impacted. However, the second processor board 36 can be configured to indicate to the first processor board 37 of a security breach such that the first processor board 37 can terminate communication with the second processor board 36 to minimize the impact of the malicious software and/or firmware on the lighting device 100. Thus, the first processor board 37 and the second processor board 36 can be configured to prevent undesirable external commands or requests from impacting the lighting device 100. Some non-limiting examples of undesirable external commands include illegal commands and/or requests, illicit commands and/or requests, or any command and/or request that may negatively impact the operation of the lighting device 100. Stated differently, the first processor board 37 and the second processor board 36 can prevent the lighting device 100 from being hacked by a nefarious party. Additionally, by having two processor boards, the lighting device 100 can shift functionality between the two processor boards as necessary if one of the processor boards because inoperable.

The first processor board 37 and the second processor board 36 can be configured to perform one or more diagnostic tests. For example, the processor boards 36, 37 can be configured to run a diagnostic test on any component of the lighting device 100. As an example, the first processor board 37 can run one or more diagnostic test on the battery 11. As another example, the second processor board 36 can run one or more diagnostic tests on sensors 34, the cameras 33, or the wireless transceiver 35. While the second processor board 36 is shown as being separate from the first processor board 37, a single processor board (e.g., controller) can include the capabilities of the first processor board 37 and the second processor board 36.

A maintenance port 38 is coupled to the second processor board 36. The maintenance port 38 can be a USB port, a RJ45 LAN connector, a serial port, or any port capable of transmitting communications. Personnel may utilize the maintenance port 38 to allow local access to the lighting device 100. For example, a computing device can be coupled to the maintenance port 38 to communicate data to the second processor board 36. Additionally, an auxiliary power port 40 can be configured to output power to a device coupled to the auxiliary power port 40. For example, the auxiliary power port 40 can be configured to output between 5V and 12V of DC power to the device coupled to the auxiliary power port 40. In an exemplary embodiment, one or more radiation detection devices (not shown) are coupled with the auxiliary power port 40 to determine radiation levels in the environment around the lighting device 100.

Figure 6:
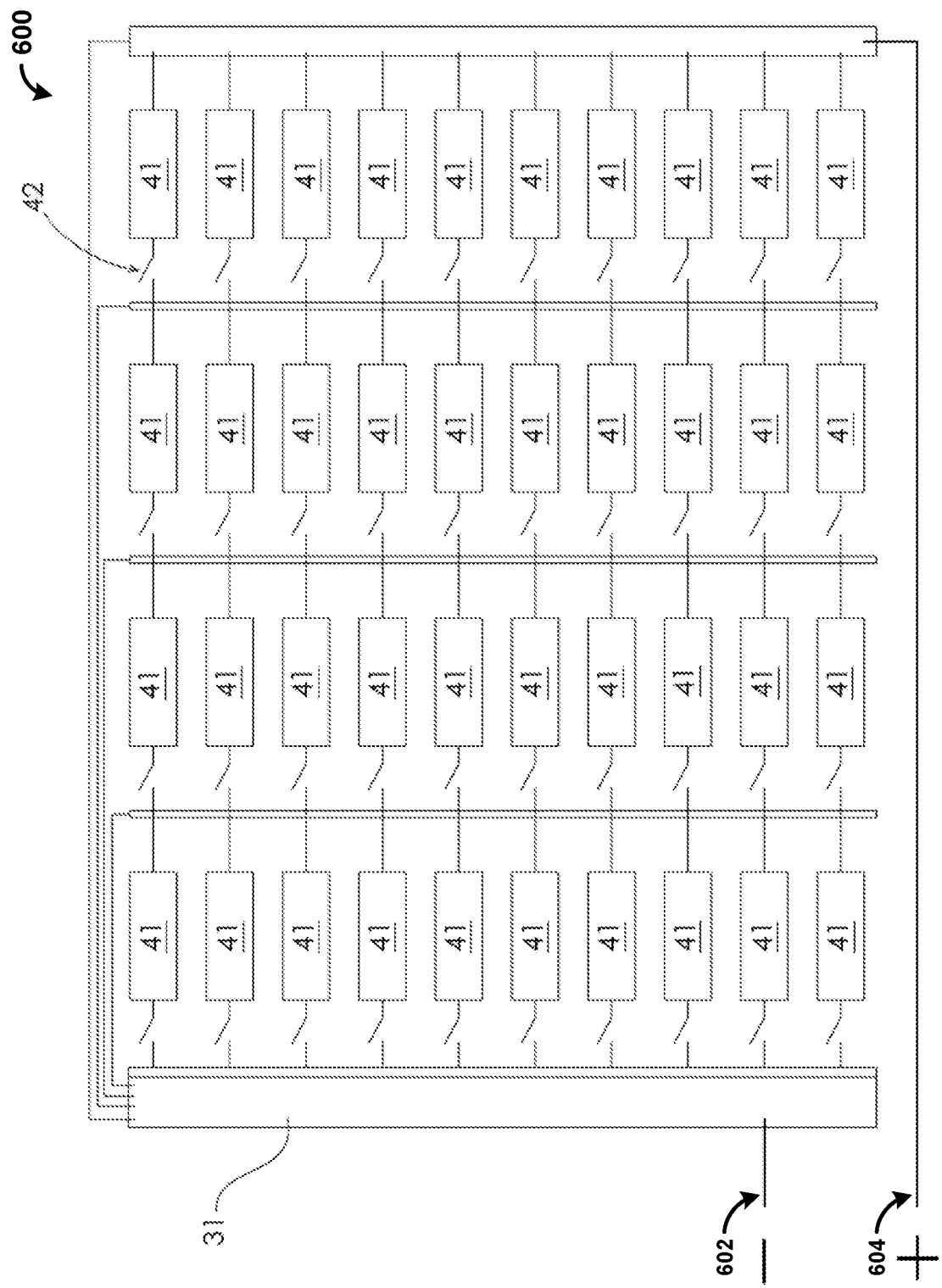
FIG. 6 illustrates an exemplary switchable test battery assembly.

FIG. 6 illustrates an exemplary switchable test battery assembly 600. For example, this assembly is a stand-alone test battery equal to the capacity of battery 11 of FIG. 1 to be utilized in lighting device 100. The switchable test battery assembly 600 comprises the battery management system 31 of FIG. 5, a plurality of battery cells 41, and a plurality of switches 42 coupled to a respective battery cell. The switchable test battery assembly has a negative voltage terminal 602 and a positive voltage terminal 604. In an aspect, the switchable test battery assembly 600 comprises a 40 ah Lithium battery.

Each of the plurality of battery cells 41 is in electrical connection with the whole assembly via a respective switch 42. A capacity of the switchable test battery assembly 600 can be altered easily on the fly between one or more diagnostic tests. For example, the maximum state of charge and/or output of the switchable test battery assembly 600 can be modified by opening and/or closing one or more of the switches 42 to remove or add battery cells 41. By modifying the maximum state of charge and/or output of the switchable test battery assembly 600, the loss of capacity over time for the switchable test battery assembly 600 can be simulated. Additionally, test result data can be determined and stored in data tables of processor board 36 based on the modifications to the switchable test battery assembly 600. For example, diagnostic tests can be run on the switchable test battery assembly 600 to determine standard values for a battery at different states of charge and/or voltages and battery temperatures over the expected operating range in order to determine a health of the battery for a given state. A plurality of tests can be done over time taking into account varying capacity levels, temperatures, and so forth, and the determined data can be stored in a database associated with the processor board 36. This data can be utilized as pass/fail reference values for future diagnostic tests of battery 11.

Figure 7:
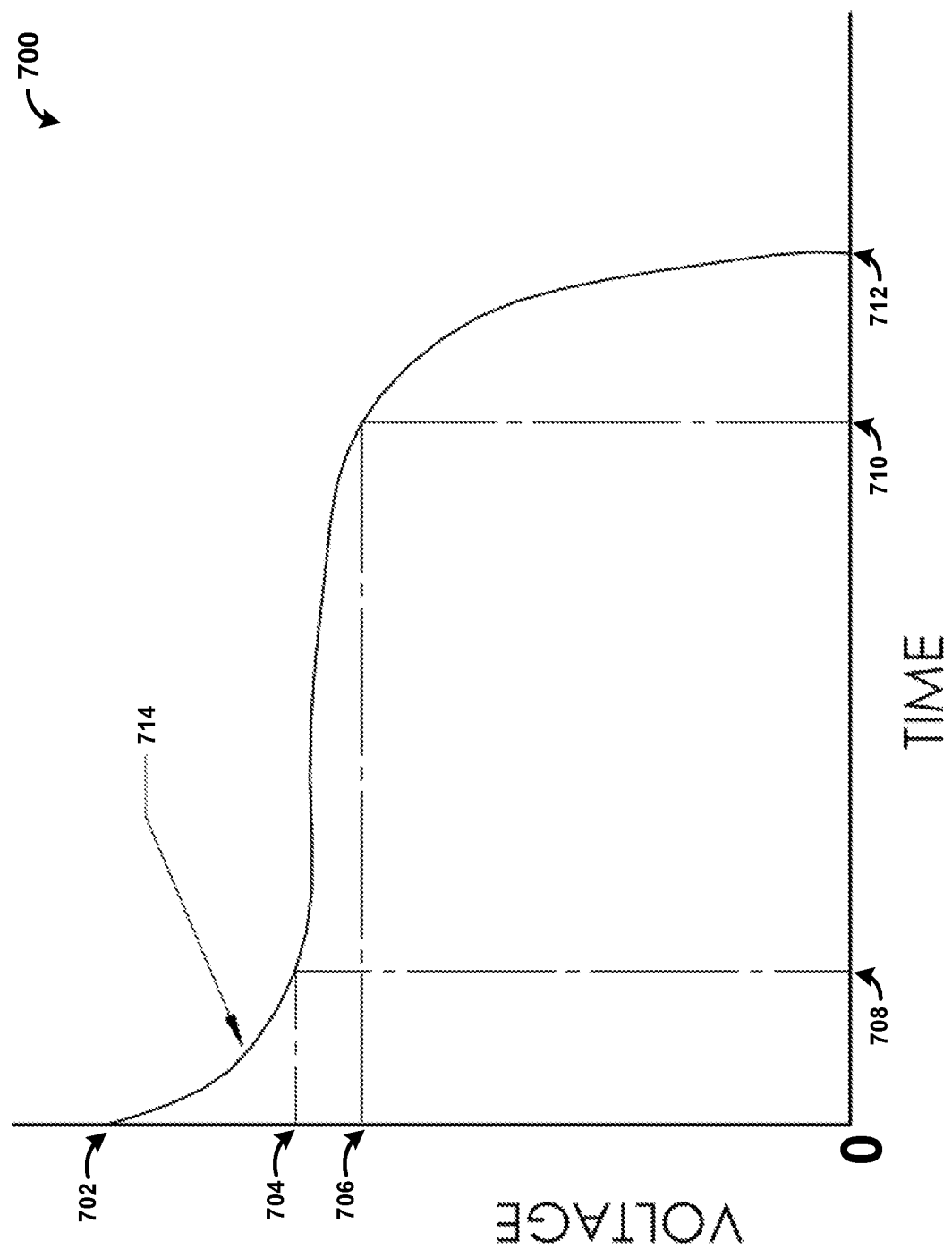
FIG. 7 illustrates an exemplary battery discharge curve.

FIG. 7 illustrates an exemplary battery discharge curve 700. In an exemplary embodiment, the battery represented by the voltage curve 700 is a Lithium Ion Phosphate (LiFePo4) battery. A full voltage of the battery is indicated by the point 702. In an exemplary embodiment, the full voltage of the battery is 14.4V. An exponential voltage is indicated by the point 704. In an exemplary embodiment, the exponential voltage is 13.3V. A nominal voltage is indicated by the point 706. In an exemplary embodiment, the nominal voltage is 12.5V. Additionally, an exponential discharge time, a nominal discharge time, and a max discharge time are indicated by points 708, 710, and 712, respectively. In an exemplary embodiment, one or more diagnostic tests are performed in an exponential area 714. The diagnostic tests are performed in the exponential area 714 because of the predictable battery response characteristics of the battery within the exponential area 714.

While an exemplary battery discharge curve 700 is provided, a person skilled in the art would appreciate that any battery discharge curve can be utilized. For example, battery manufacturers publish battery discharge curves for different cell types, ampacity, temperature, lifetime cycle count, etc. A lifetime expectancy of the battery can normally be estimated based on this information if cycle count is known. However, in certain applications with very low or no cycle count, such as with an emergency lighting control device, an alternate means of testing must be employed to determine the present and predictive state of health of the battery assembly. Lithium chemistry has no memory effect, long 15+ year lifetime, and cell capacity is degraded over life primarily from discharge/charge cycle count, depth of discharge, temperature, and terminal charge voltage. Lithium precipitation and "holes" developed in the lithium layer are factors that inhibit the design capacity of the cell assembly. Regardless the reason of capacity reduction, the testing described herein can generally predict the approximate battery state of health over lifetime.

Figure 8A:
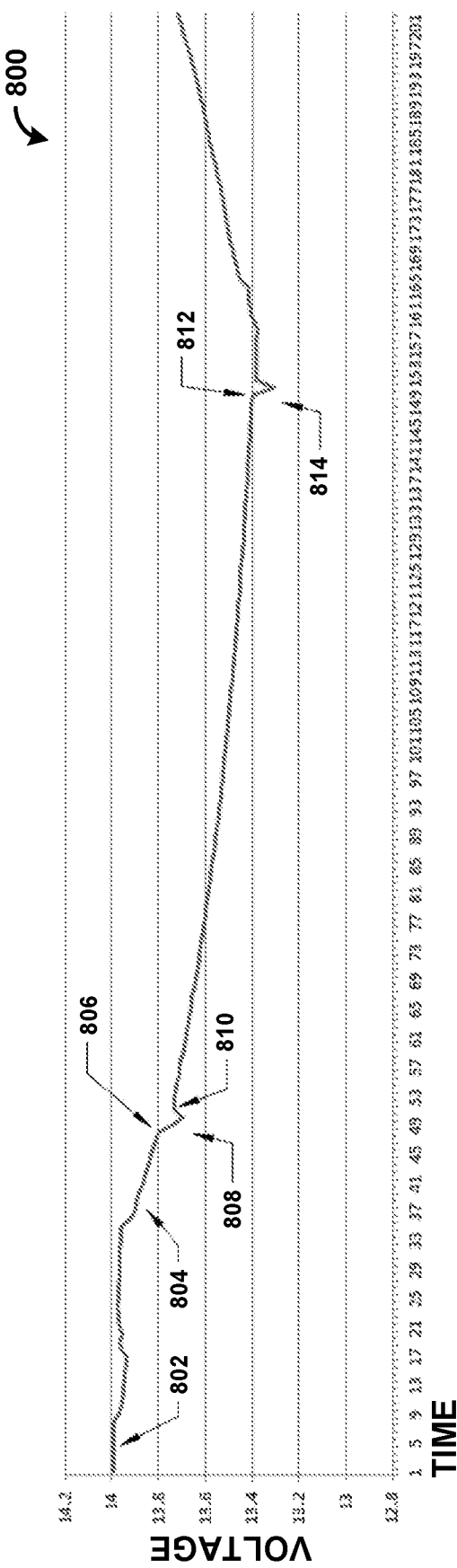
FIGS. 8A-8B illustrate exemplary test curves utilized for predictive maintenance.

FIG. 8A illustrates an exemplary test curve 800 utilized for predictive maintenance A first test method is a voltage over time test (V/T), and a second test is an impulse discharge test. The battery will start off near a maintained (e.g., fixed) voltage as shown by point 802. In an exemplary embodiment, the battery is maintained at a fixed voltage near 14V to 14.4V. To execute these tests, the lighting device 100 is configured to activate the test in progress indicator 18. The headlamps 12 are turned on and the battery drain rate is set to a constant test drain rate. For example, the lighting device 100 is configured to regulate the output current of the battery charger 24 at 1.00 amps. The activation of the constant test drain rate is indicated by point 804. Once the test drain rate is established, a base battery drain curve is now established and will continue for several minutes. At a chosen point 806 (e.g., at 13.8 V), an impulse test resistor is energized to "bump" test the battery, indicated by point 808, to a high amp draw for a few seconds. The battery voltage will droop and rebound to a distinct lower voltage, indicated by point 810. The difference in voltage between points 806 and 810 can be captured, logged, and then compared to known acceptable values for the battery. Results can be indicated by a pass/fail score, or as an Ah capacity value. Point 814 is shown to contrast what an impulse test performed at the bottom of the curve shows as compared to an impulse test performed towards the top of the curve (e.g., at point 808). Although both points 808 and 814 are in the exponential area of the curve, greater differential results can be obtained from a test performed at the point 808.

With the test drain rate is established, the battery drain curve in the exponential area will continue for several minutes before leveling off. Points 806 and 812 are two pre-established voltage monitoring points and the time it takes for the battery to discharge between these two points will vary based on the state of capacity or state of health of the battery. A healthy battery will take a longer period of time to discharge between points 806 and 812, as compared to a degraded battery that will have a shorter time period between points 806 and 812. At point 812, the V/T test data is captured and saved.

The test data can be compared to previously determined drain data obtained from switchable test battery assembly 600 of FIG. 6 to determine a state of health of the battery. One or more actions can be taken based on the state of the health of the battery. For example, a 40 ah battery in a lighting device is expected to be replaced before the battery state of health reaches 20 ah. When test results indicate that a full charged battery capacity is near the 20 ah level, the lighting device 100 will indicate a test fail and alarm remotely that attention or maintenance is required for the lighting device 100.

Figure 8B:
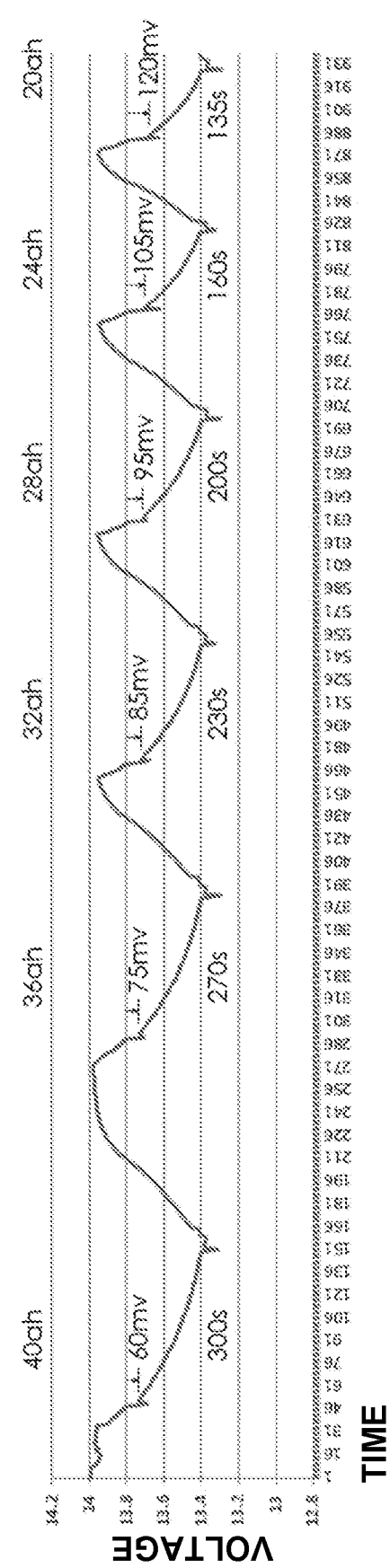

FIG. 8B illustrates an exemplary test curve 850 utilized for predictive maintenance. Specifically, the exemplary test curve 850 illustrates several subsequent test data sets obtained from the test battery of FIG. 6. Note as battery ampacity lowers the V/T and impulse test results are very easy to distinguish or differentiate between the various levels at a given temperature.

Figure 9:
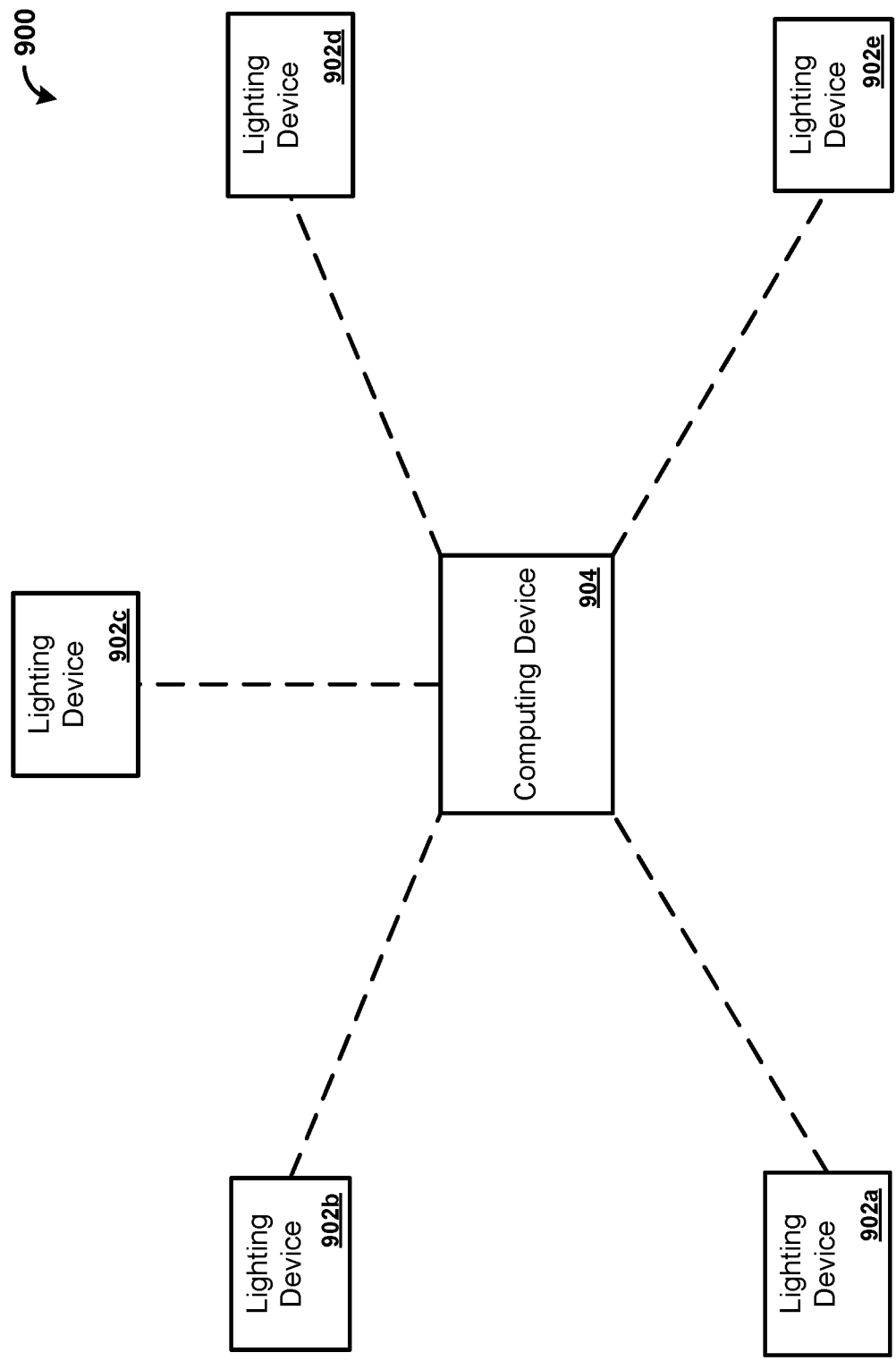
FIG. 9 illustrates an exemplary system for lighting devices.

FIG. 9 illustrates an exemplary system 900 for lighting devices. The system 900 comprises a plurality of lighting devices 902 (e.g., the lighting device 100 of FIG. 1) and a computing device 904. The lighting devices 902 can be portable lighting devices or lighting devices affixed to a structure (e.g., permanently installed and not easily portable). The system 900 can be implemented within a commercial or industrial complex such that the computing device 904 is remotely located from the plurality of lighting devices 902. The computing device 904 can be configured to communicate with the plurality of lighting devices 902. For example, the computing device 904 can comprise a wireless transceiver that is configured to communicate via a wireless network that the plurality of lighting devices 902 are in communication with. The computing device 904 can send and/or receive communications (e.g., data, notifications, etc.) to/from the plurality of lighting devices 902. The computing device 904 can be configured to determine a location of each of the plurality of lighting devices 902. For example, the lighting devices 902 can provide the computing device 904 with the location of the lighting devices 902 and/or the computing device 904 can determine the location of the lighting devices 902. While one computing device 904 and five lighting devices 902*a,b,c,d,e* are shown for ease of explanation, the system 900 can include any number of computing devices 904 and lighting devices 902.

The computing device 904 can be configured to monitor the plurality of lighting devices 902. The computing device 904 can be configured to send a request to all or some of the plurality of lighting devices 902. The computing device 904 can be configured to send the request to the plurality of lighting devices 902 automatically. For example, the computing device 904 can be configured to send the request to the plurality of lighting devices 902 at a set interval (e.g., once a week, once a month, once a quarter, yearly, etc.). The request can be to perform one or more diagnostic tests. For example, the diagnostic tests can determine whether any of the components of the lighting devices 902 are not operating normally. The one or more diagnostic tests can indicate a state of health of a battery of each of the plurality of lighting devices 902. For example, the state of health of the battery can indicate at least one of an expected run time of the apparatus, a headlamp runtime, a life expectancy of the battery, a maximum charge of the battery, a maximum voltage of the battery, a state of charge of the battery, and/or a voltage of the rechargeable battery. The computing device 904 can send a request to each of the plurality of lighting devices 902. The computing device 904 can send a request to a subset (e.g., a group) of the plurality of lighting devices 902. As an example, the computing device 904 can send a request to the lighting devices 902a,b and not send the request to the lighting devices 902c,d,e. The computing device 904 can wait for the lighting devices 902a,b to complete the diagnostic tests, and then can send the request to the lighting devices 902c,d,e.

The lighting devices 902 can receive the request from the computing device 904, and perform the one or more diagnostic tests. For example, the lighting device 902 can run a diagnostic test on one or more components of the lighting device 902 to ensure that the components of the lighting device 902 are operating normally. The lighting devices 902 can send the results of the one or more diagnostic tests to the computing device 904. The results of the one or more diagnostic tests can be data (e.g., the exemplary test curve 800 of FIG. 8A) or the results can indicate the state of health of the battery (e.g., operating within a normal threshold, operating normally but the battery is nearing the end of its life, needs to be replaced, etc.). For example, the state of health of the battery can indicate at least one of an expected run time of the apparatus, a headlamp runtime, a life expectancy of the battery, a maximum charge of the battery, a maximum voltage of the battery, a state of charge of the battery, and/or a voltage of the rechargeable battery. If the computing device 904 receives data from the lighting devices 902, the computing device 904 can determine the state of health of the battery based on the data. The computing device 904 can be configured to store the results of the diagnostic tests within a database to monitor (e.g., keep track) of each of the lighting devices over a period of time. That is, the computing device 904 can be configured to determine a history of the results of the diagnostic tests for each of the lighting devices 902.

The computing device 904 can be configured to send the request based on a history of the results of the diagnostic tests for a lighting device 902. For example, if the lighting device 902a had a result that indicated the battery of the lighting device 902a was well within the operating parameters for the battery, the computing device 902 may determine to wait an extended period of time before requesting the lighting device 902a perform another diagnostic test because the battery would be unlikely to drop outside of acceptable operating parameters in that extended period of time. Conversely, if the lighting device 902 had a result that indicated that the battery of the lighting device 902 is nearing the end of its life, but is not quite ready for replacement, the computing device 904 can be configured to request the lighting device 902a perform another diagnostic test sooner since the battery is more likely to need to be replaced sooner rather than later.

The computing device 904 can be configured to generate one or more notifications based on the results of the diagnostic tests sent by the lighting devices 902. The computing device 904 can generate a notification that indicates which of the plurality of lighting devices 902 are operating normally, which of the plurality of lighting devices 902 will need to have a battery replaced soon, which of the plurality of lighting devices 902 that need to have a battery replaced, which of the plurality of lighting devices 902 that have failed, and so forth. The computing device 904 can provide the one or more notifications to another computing device or can cause the one or more notifications to be displayed for a user to view the one or more notifications. The computing device 904 can store any generated notifications within a database to have a history of notifications generated related to the lighting devices 902.

The computing device 904 can be configured to request data that indicates one or more environmental characteristics of an environment (e.g., an ambient environment) external to the lighting devices 902. The lighting devices 902 can comprise one or more sensors (e.g., a temperature sensor, a humidity sensor, a light sensor, a smoke sensor, a carbon monoxide sensor, a gas sensor, a chemical sensor, and/or a radiation sensor) that produce data based on what the sensor is measuring. The computing device 904 can receive the data that indicates the environmental characteristics can store the data within a database. The computing device 904 can generate one or more notifications based on the environmental characteristics. For example, if the lighting device 902e sends temperature data that indicates the temperature is significantly higher than normal, the computing device 904 can be configured to generate an alarm to indicate that the lighting device 902e is likely near a fire. The alarm can include the location of the lighting device 902e to facilitate sending emergency personnel to the fire. Additionally, the lighting devices 902 can be configured to generate one or more notifications based on the measured environmental characteristics. Returning the previous example, instead of the computing device 904 requesting the data, the lighting device 902 can generate a notification when the temperature reaches a threshold that indicates a fire. In this manner, both the lighting devices 902 and the computing device 904 can be configured to generate one or more notifications based on environmental characteristics around the lighting devices 902.

The lighting devices 902 can comprise one or more cameras (e.g., a still camera, a video camera, an infrared camera, etc.) that produce still images and/or videos. The lighting devices 902 can be distributed throughout a space such that the one or more cameras of the lighting devices 902 are capable of functioning as security cameras throughout the space. For example, the computing device 904 can receive the still images and/or videos from the lighting devices 902. The computing device 904 can generate one or more notifications based on the received still images and/or videos. For example, if the still images and/or videos indicate breach in security, the computing device 904 can be configured to generate an alarm to indicate the security breach. The alarm can indicate the location of the lighting device 902 associated with the breach in security and/or the alarm can indicate the location of the breach in security.

Additionally, the lighting devices 902 can be configured to generate one or more notifications based on the measured environmental characteristics. Returning the previous example, instead of the computing device 904 requesting the data, the lighting device 902 can generate a notification when the temperature reaches a threshold that indicates a fire. In this manner, both the lighting devices 902 and the computing device 904 can be configured to generate one or more notifications based on environmental characteristics around the lighting devices 902.

Figure 10:
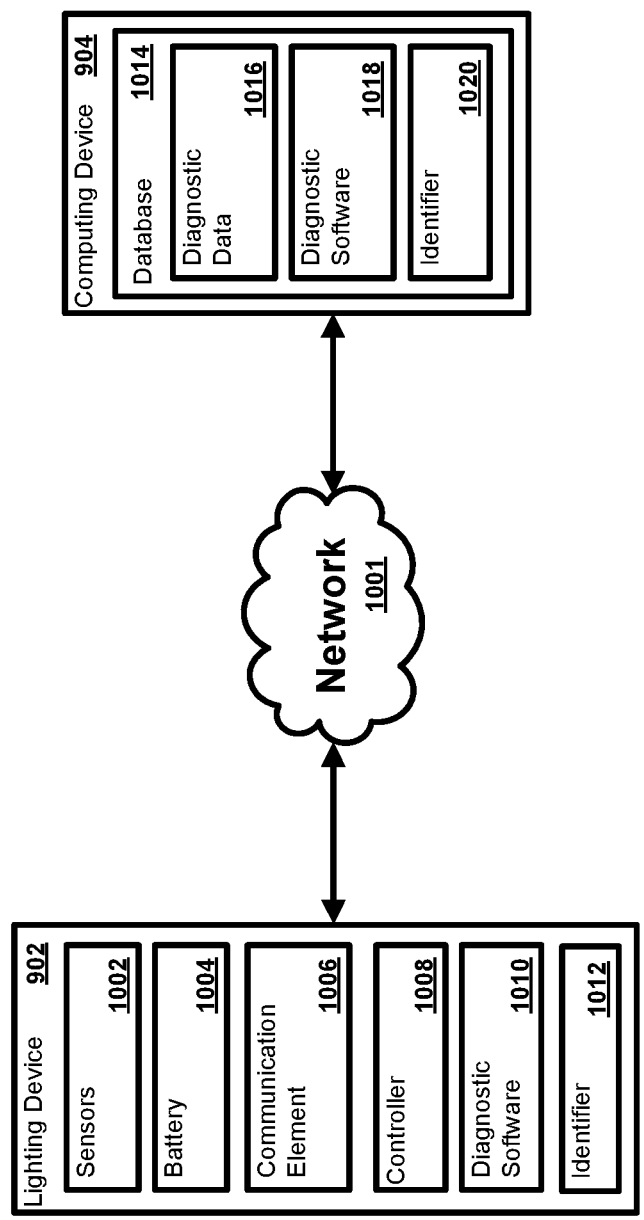
FIG. 10 illustrates an exemplary system for lighting devices.

FIG. 10 illustrates an exemplary system 1000 for lighting devices. The system 1000 comprises a lighting device 902 and a computing device 904. The computing device 904 and the lighting device 902 are in communication with the network 1001. The lighting device 902 comprises sensors 1002, a battery 1004, a communication element 1006, a controller 1008, diagnostic software 1010, and an identifier 1012.

The sensors 1002 can be one or more sensors configured to measure one or more environmental characteristics. The sensors 1002 can be a temperature sensor, a humidity sensor, a light sensor, a smoke sensor, a carbon monoxide sensor, a gas sensor, a chemical sensor, and/or a radiation sensor. The lighting device 902 can utilize the sensors 1002 to determine one or more environmental characteristics of an environment around the lighting device 902. Additionally, the sensors 1002 can include one or more cameras configured to capture one or more still images and/or videos.

The battery 1004 can be any battery. For example, the battery 1004 is a rechargeable battery. In an exemplary embodiment, the battery 1004 comprises a Lithium Iron Phosphate battery (LifePo$_4$) battery. The LifePo$_4$ battery can reduce the weight of the lighting device 902, has a robust life expectancy, and good ability to hold a charge for long periods of time between charge cycles, which would allow the battery 1004 to remain in storage for extended periods of time without the need to be plugged into an AC power source. Additionally, the battery 1004 can comprise a battery assembly that is configured to determine information associated with the battery 1004 and communicate the determined information to a computing device (e.g., the computing device 904). For example, the battery assembly can determine discrete cell (e.g., the battery cells 41 of FIG. 5) and assembly voltage of the battery 1004, a total power available of the battery 1004, a state of charge of the battery 1004, and/or a temperature associated with the battery assembly. Additionally, the battery assembly can determine an amount of power discharged by the battery 1004, and/or an amount of power received by the battery 1004. For example, the battery assembly can determine the amount of power discharged (e.g., output) by the battery 1004 in coulombs, as well as determine the amount of power received (e.g., input) by the battery 1004 in coulombs. That is, the battery assembly can determine how much the battery 1004 has been charged, as well as determine how much power the battery 1004 has discharged. The battery assembly can be configured to provide (e.g., send) the determined information to the computing device. Thus, the battery 1004 can determine information associated with the battery 1004, and provide the determined information to the computing device.

The communication element 1006 can be a wireless transceiver configured to communicate via a wireless network (e.g., a Wi-Fi, Bluetooth, NFC, etc.). The lighting device 902 can utilize the communication element 1006 to communicate with the computing device 904 via the network 1001. The controller 1008 can be configured to control the lighting device 902. For example, the controller 1008 can comprise a processor that executes firmware and/or software to control operation of the lighting device 902.

The diagnostic software 1010 can be firmware and/or software configured to execute one or more diagnostic tests. For example, the diagnostic software 1010 can determine a state of health of the lighting device 902 and/or the battery 1004. As another example, the diagnostic software 1010 can run a diagnostic test on any component of the lighting device 902 to determine a state of the component. The diagnostic software 1010 can provide the results of the one or more diagnostic tests to the computing device 904 via the network 1001.

The identifier 1012 can be any identifier, token, character, string, or the like, for differentiating one user or lighting device (e.g., the lighting device 902) from another user or computing device. The device identifier 1012 may identify a user or computing device as belonging to a particular class of users or computing devices. The device identifier 1012 may comprise information relating to the lighting device 902 such as a manufacturer, a model or type of device, a service provider associated with the lighting device 902, a state of the lighting device 902, a locator, and/or a label or classifier. Other information may be represented by the device identifier 1012.

The computing device 904 can comprise a database 1014 that has diagnostic data 1016, diagnostic software 1018, and an identifier 1020. The computing device 904 can manage the communication between the lighting device 902 and the database 1014 for sending and receiving data there between. The database 1014 can be one or more storage devices that are either internal to the computing device 904 or external to the computing device 904. The database 1014 can be integrated with the computing device 904 or some other device or system. The computing device 904 can store diagnostic data 1016 within the database 1014. The computing device 904 can receive diagnostic data from the lighting device 902 via the network 1001. The computing device 904 can be configured to store the diagnostic data to monitor a history of the diagnostic data of the lighting device 902.

The diagnostic software 1018 can be firmware and/or software configured to execute one or more diagnostic tests. The one or more diagnostic tests can determine a status of any component of a device (e.g., the lighting device 902). For example, the diagnostic software 1018 can send a request to the lighting device 902 to determine a state of health of the lighting device 902 and/or the battery 1004. The diagnostic software 1018 can receive the results from the lighting device 902. The diagnostic software 1018 can generate one or more notifications based on the results of the one or more diagnostic tests.

The identifier 1020 can be any identifier, token, character, string, or the like, for differentiating one user or lighting device (e.g., the computing device 904) from another user or computing device. The device identifier 1020 may identify a user or computing device as belonging to a particular class of users or computing devices. The device identifier 1020 may comprise information relating to the computing device 904 such as a manufacturer, a model or type of device, a service provider associated with the computing device 904, a state of the computing device 904, a locator, and/or a label or classifier. Other information may be represented by the device identifier 1020.

Figure 11:
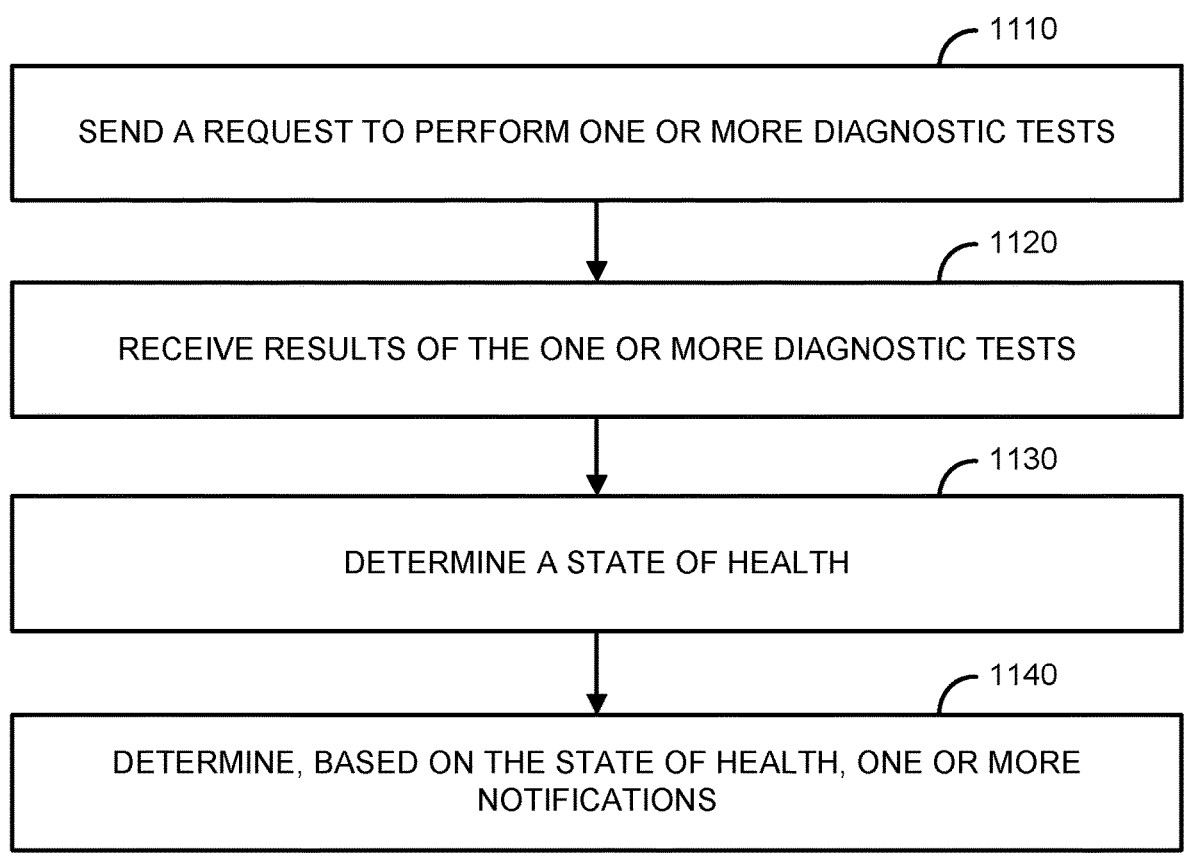
FIG. 11 illustrates a flowchart of an exemplary method for controlling lighting devices.

FIG. 11 illustrates a flowchart of an example method 1100 for controlling lighting devices. At step 1110, a computing device (e.g., the computing device 904 of FIGS. 9 & 10) can send a request to perform one or more diagnostic tests. The computing device can send the request to a plurality of lighting devices (e.g., the lighting device 100 of FIG. 1 and/or the lighting device 902 of FIGS. 9 & 10). The one or more diagnostic tests can be associated with one or more components of the lighting device. Each of the plurality of lighting devices can comprise a respective rechargeable battery. The one or more diagnostic tests can be associated with the respective rechargeable battery. The computing device can send a plurality of requests to the lighting devices to perform the one or more diagnostic tests over a period of time. The lighting devices can comprise a rechargeable battery assembly comprising a rechargeable battery, wherein the rechargeable battery assembly is configured to communicate at least one of discrete cell and assembly voltage of the rechargeable battery, a total power available of the rechargeable battery, a state of charge of the rechargeable battery, a temperature associated with the rechargeable battery assembly, an amount of power discharged by the rechargeable battery, or an amount of power received by the rechargeable battery.

At step 1120, results of the one or more diagnostic tests can be received. The computing device can receive the results of the one or more diagnostic tests from one or more lighting devices of the plurality of lighting devices. The results can be received over a period of time. The computing device can store the results within a database. The results of the diagnostic tests can indicate a respective state of health of the lighting device or a respective state of health of the rechargeable battery.

At step 1130, a state of health is determined. For example, at least one of respective state of health of the lighting device or a respective state of health of the rechargeable battery can be determined. The computing device can determine the at least one of respective state of health of the lighting device or a respective state of health of the rechargeable battery. The state of health of the lighting device can indicate a state of health of one or more components of the lighting device. For example, the state of health of the lighting device can indicate if the components are operating normally or have failed. The state of health of the rechargeable battery can indicate at least one of an expected run time of the apparatus, a headlamp runtime, a life expectancy of the rechargeable battery, a maximum charge of the rechargeable battery, a maximum voltage of the rechargeable battery, a state of charge of the rechargeable battery, and/or a voltage of the rechargeable battery. Whether the respective rechargeable battery satisfies a first threshold, a second threshold, or a third threshold can be determined by the computing device. Satisfying the first threshold indicates that the respective rechargeable battery is operating normally. Satisfying the second threshold indicates that the respective rechargeable battery should be replaced within a period of time. Satisfying the third threshold indicates that the respective rechargeable battery needs to be replaced. The computing device can modify the first threshold, the second threshold, or the third threshold to accurately indicate the respective state of health based on determining that the first threshold, the second threshold, or the third threshold does not accurately indicate the respective state of health.

At step 1140, one or more notifications can be determined based on the state of health. The computing device can determine the one or more notifications. The computing device can generate the one or more notifications. The computing device can send the one or more notifications to another computing device or the computing device can cause display of the one or more notifications for a user to view. The notifications can indicate the respective state of health of the lighting device and/or the respective state of health of the rechargeable battery.

Figure 12:
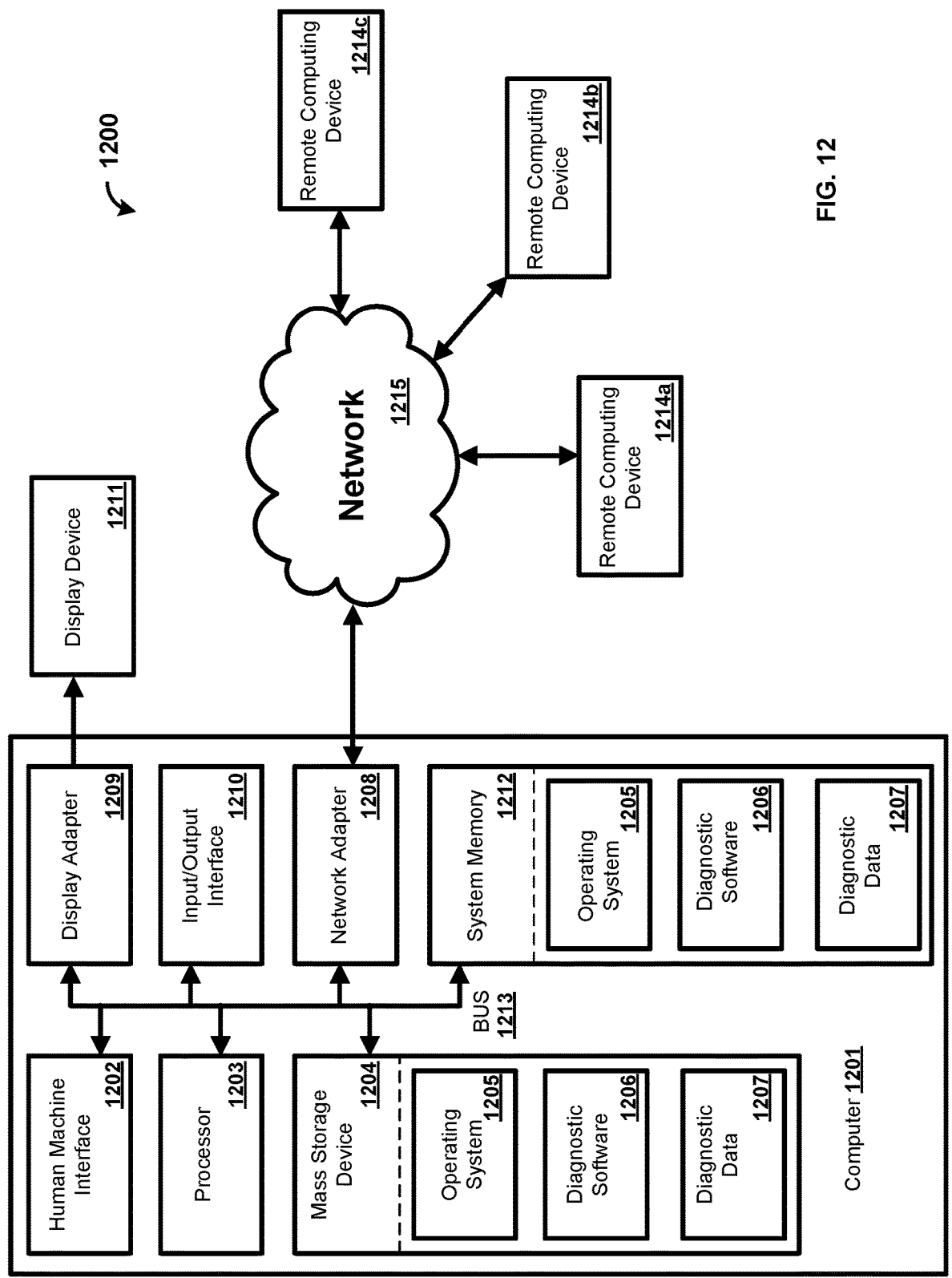
FIG. 12 illustrates a block diagram of an exemplary computing device.

FIG. 12 shows an example system 1200 of an exemplary computing device. The lighting device 100 of FIG. 1, and the lighting devices 902 and the computing device 904 of FIGS. 9 & 10 may be a computer 1201 as shown in FIG. 12.

The computer 1201 may comprise one or more processors 1203, a system memory 1212, and a bus 1213 that couples various system components including the one or more processors 1203 to the system memory 1212. In the case of multiple processors 1203, the computer 1201 may utilize parallel computing. The bus 1213 is one or more of several possible types of bus structures, including a memory bus or memory controller, a peripheral bus, an accelerated graphics port, or local bus using any of a variety of bus architectures.

The computer 1201 may operate on and/or comprise a variety of computer readable media (e.g., non-transitory). The readable media may be any available media that is accessible by the computer 1201 and may include both volatile and non-volatile media, removable and non-removable media. The system memory 1212 has computer readable media in the form of volatile memory, such as random access memory (RAM), and/or non-volatile memory, such as read only memory (ROM). The system memory 1212 may store data such as the diagnostic data 1207 and/or program modules such as the operating system 1205 and the diagnostic software 1206 that are accessible to and/or are operated on by the one or more processors 1203.

The computer 1201 may also have other removable/non-removable, volatile/non-volatile computer storage media. FIG. 12 shows the mass storage device 1204 which may provide non-volatile storage of computer code, computer readable instructions, data structures, program modules, and other data for the computer 1201. The mass storage device 1204 may be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EE-PROM), and the like.

Any quantity of program modules may be stored on the mass storage device 1204, such as the operating system 1205 and the diagnostic software 1206. Each of the operating system 1205 and the diagnostic software 1206 (or some combination thereof) may have elements of the program modules and the diagnostic software 1206. The diagnostic data 1207 may also be stored on the mass storage device 1204. The diagnostic data 1207 may be stored in any of one or more databases known in the art. Such databases may be DB2®, Microsoft® Access, Microsoft® SQL Server, Oracle®, mySQL, PostgreSQL, and the like. The databases may be centralized or distributed across locations within the network 1215.

A user may enter commands and information into the computer 1201 via an input device (not shown). Examples of such input devices comprise, but are not limited to, a keyboard, pointing device (e.g., a computer mouse, remote control), a microphone, a joystick, a scanner, tactile input devices such as gloves, and other body coverings, motion sensor, and the like. These and other input devices may be connected to the one or more processors 1203 via a human machine interface 1202 that is coupled to the bus 1213, but may be connected by other interface and bus structures, such as a parallel port, game port, an IEEE 1394 Port (also known as a Firewire port), a serial port, network adapter 1208, and/or a universal serial bus (USB).

The display device 1211 may also be connected to the bus 1213 via an interface, such as the display adapter 1209. It is contemplated that the computer 1201 may have more than one display adapter 1209 and the computer 1201 may have more than one display device 1211. The display device 1211 may be a monitor, an LCD (Liquid Crystal Display), light emitting diode (LED) display, television, smart lens, smart glass, and/or a projector. In addition to the display device 1211, other output peripheral devices may be components such as speakers (not shown) and a printer (not shown) which may be connected to the computer 1201 via the Input/Output Interface 1210. Any step and/or result of the methods may be output (or caused to be output) in any form to an output device. Such output may be any form of visual representation, including, but not limited to, textual, graphical, animation, audio, tactile, and the like. The display device 1211 and computer 1201 may be part of one device, or separate devices.

The computer 1201 may operate in a networked environment using logical connections to one or more remote computing devices 1214*a,b,c*. A remote computing device may be a personal computer, computing station (e.g., workstation), portable computer (e.g., laptop, mobile phone, tablet device), smart device (e.g., smartphone, smart watch, activity tracker, smart apparel, smart accessory), security and/or monitoring device, a server, a router, a network computer, a peer device, edge device, and so on. Logical connections between the computer 1201 and a remote computing device 1214*a,b,c* may be made via a network 1215, such as a local area network (LAN) and/or a general wide area network (WAN). Such network connections may be through the network adapter 1208. The network adapter 1208 may be implemented in both wired and wireless environments. Such networking environments are conventional and commonplace in dwellings, offices, enterprise-wide computer networks, intranets, and the Internet.

Application programs and other executable program components such as the operating system 1205 are shown herein as discrete blocks, although it is recognized that such programs and components reside at various times in different storage components of the computing device 1201, and are executed by the one or more processors 1203 of the computer. An implementation of the diagnostic software 1206 may be stored on or sent across some form of computer readable media. Any of the described methods may be performed by processor-executable instructions embodied on computer readable media.

While specific configurations have been described, it is not intended that the scope be limited to the particular configurations set forth, as the configurations herein are intended in all respects to be possible configurations rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of configurations described in the specification.

It will be apparent to those skilled in the art that various modifications and variations may be made without departing from the scope or spirit. Other configurations will be apparent to those skilled in the art from consideration of the specification and practice described herein. It is intended that the specification and described configurations be considered as exemplary only, with a true scope and spirit being indicated by the following claims.

What is claimed is:

1. An apparatus, comprising:
    an enclosure;
    a rechargeable battery assembly comprising a rechargeable battery, wherein the rechargeable battery assembly is configured to communicate at least one of discrete cell and assembly voltage of the rechargeable battery, a total power available of the rechargeable battery, a state of charge of the rechargeable battery, a temperature associated with the rechargeable battery assembly, an amount of power discharged by the rechargeable battery, or an amount of power received by the rechargeable battery;
    a power port coupled to the enclosure, wherein the power port is configured to receive power from an external power source;
    a plurality of headlamps configured to receive power from at least one of the rechargeable battery assembly or the external power source;
    a mode switch configured to control an output of the plurality of headlamps, wherein the mode switch has one or more positions that indicate that the output of the plurality of headlamps is one of off, on, or automatic, wherein the automatic output causes the plurality of headlamps to automatically discharge light upon a loss of power from the external power source; and a controller configured to perform one or more diagnostic tests on the apparatus to determine:
    a state of health of the rechargeable battery, and
    a state of health of one or more components of the apparatus; and
    a test button configured to cause the apparatus to perform the one or more diagnostic tests.

2. The apparatus of claim 1, wherein the controller is further configured to determine, based on the state of health of the rechargeable battery, whether the rechargeable battery satisfies a first threshold, a second threshold, or a third threshold, wherein satisfying the first threshold indicates that the rechargeable battery is operating normally, wherein satisfying the second threshold indicates that the rechargeable battery should be replaced within a period of time, and wherein satisfying the third threshold indicates that the rechargeable battery needs to be replaced.

3. The apparatus of claim 1, wherein the controller is further configured to:
    perform automatic scheduled diagnostic tests on at least one of the rechargeable battery or the apparatus,
    receive, via a wireless network from a computing device, a request to perform the one or more diagnostic tests, and
    transmit, via the wireless network to the computing, data that indicates results of the one or more diagnostic tests.

4. The apparatus of claim 3, wherein a layer of cyber security exists between the wireless network and the controller to prevent undesired commands or requests from impacting the apparatus.

5. The apparatus of claim 1, wherein the apparatus is at least one of portable or permanently affixed to a structure, the apparatus further comprising:
    a recording device configured to capture at least one of still images or videos;
    one or more sensors configured to determine one more characteristics of an environment external to the apparatus; and
    a wireless transceiver configured to communicate via one or more wireless networks.

6. The apparatus of claim 5, wherein the one or more sensors comprises at least one of a temperature sensor, a humidity sensor, a light sensor, a smoke sensor, a carbon monoxide sensor, a gas sensor, a chemical sensor, or a radiation sensor.

7. The apparatus of claim 1, wherein the state of health of the rechargeable battery indicates at least one of an expected run time of the apparatus, a headlamp runtime, a life expectancy of the rechargeable battery, the state of charge of the rechargeable battery, or a voltage of the rechargeable battery.

8. The apparatus of claim 1, further comprising a plurality of indicators that indicate at least one of the state of charge of the rechargeable battery, the state of health of the rechargeable battery, a fault associated with the rechargeable battery, a fault associated with the apparatus, a testing status of the apparatus, or a power output of the rechargeable battery.

9. A system, comprising:
a plurality of lighting devices, wherein each of the plurality of lighting devices comprises:
an enclosure,
a plurality of headlamps,
a rechargeable battery,
a recording device configured to capture at least one of still images or videos, one or more sensors configured to determine one or more characteristics of an environment external to the enclosure,
a wireless transceiver configured to communicate via one or more wireless networks, and a controller configured to perform one or more diagnostic tests associated with one or more of the plurality of lighting devices and the rechargeable battery; and
a computing device, configured to:
send, to the plurality of lighting devices, a request to perform the one or more diagnostic tests associated with the rechargeable battery;
receive, from one or more lighting devices of the plurality of lighting devices, respective results of the one or more diagnostic tests;
determine, for each of the one or more lighting devices, at least one of a respective state of health of the one or more of the plurality of lighting devices or a respective state of health of the rechargeable battery associated with each of the one or more lighting devices; and
determine, based on the respective state of health, one or more notifications.

10. The system of claim 9, wherein the computing device is further configured to determine, based on the respective state of health, whether the respective rechargeable battery satisfies a first threshold, a second threshold, or a third threshold, wherein satisfying the first threshold indicates that the respective rechargeable battery is operating normally, wherein satisfying the second threshold indicates that the respective rechargeable battery should be replaced within a period of time, and wherein satisfying the third threshold indicates that the respective rechargeable battery needs to be replaced.

11. The system of claim 10, wherein the computing device is further configured to:
send, to the plurality of lighting devices, a plurality of requests to perform the one or more diagnostic tests associated with the rechargeable battery over a duration;
receive a plurality of results of the one or more diagnostic tests over the period of time;
determine, based on the plurality of results of the one or more diagnostic tests, that at least one of the first threshold, the second threshold, or the third threshold does not accurately indicate the respective state of health; and
modify, based on the plurality of results of the one or more diagnostic tests, the at least one of the first threshold, the second threshold, or the third threshold to accurately indicate the respective state of health.

12. The system of claim 9, wherein the controller is further configured to:
receive, via the one or more wireless networks from the computing device, the request to perform the one or more diagnostic tests associated with the rechargeable battery, and
transmit, via the one or more wireless networks to the computing device, data that indicates one or more of the respective results.

13. The system of claim 9, wherein the respective state of health of the rechargeable battery indicates at least one of an expected run time of the respective lighting device, a headlamp runtime, a life expectancy of the rechargeable battery, a state of charge of the rechargeable battery, or a voltage of the rechargeable battery.

14. The system of claim 9, wherein the one or more sensors comprises at least one of a temperature sensor, a humidity sensor, a light sensor, a smoke sensor, a carbon monoxide sensor, a gas sensor, a chemical sensor, or a radiation sensor.

15. The system of claim 9, wherein the plurality of lighting devices are at least one of portable or permanently affixed to a structure, and wherein each of the plurality of lighting devices further comprises a plurality of indicators that indicate at least one of a state of charge of the rechargeable battery, a state of health of the rechargeable battery, a fault associated with the rechargeable battery, a fault associated with the system, a testing status of the system, or a power output of the rechargeable battery.

16. A method, comprising:
sending, by a computing device to a plurality of lighting devices, a request to perform one or more diagnostic tests, wherein each of the plurality of lighting devices comprises a respective rechargeable battery;
receiving, by the computing device from one or more lighting devices of the plurality of lighting devices, respective results of the one or more diagnostic tests;
determining, by the computing device for each of the one or more lighting devices, at least one of a respective state of health of the one or more lighting devices or a respective state of health of the rechargeable battery associated with each of the one or more lighting devices;
determining, by the computing device based on the respective state of health, one or more notifications;
sending, to the plurality of lighting devices, a plurality of requests to perform the one or more diagnostic tests associated with the rechargeable battery over a period of time;
receiving a plurality of results of the one or more diagnostic tests over the period of time;
determining, based on the plurality of results of the one or more diagnostic tests, that a threshold does not accurately indicate the respective state of health; and
modifying, based on the plurality of results of the one or more diagnostic tests, the threshold to accurately indicate the respective state of health.

17. The method of claim 16, wherein the respective state of health of the rechargeable battery indicates at least one of an expected run time of the respective lighting device, a headlamp runtime, a life expectancy of the rechargeable battery, a state of charge of the rechargeable battery, or a voltage of the rechargeable battery.

18. The method of claim 16, wherein the plurality of lighting devices are at least one of portable or permanently affixed to a structure, and wherein each of the plurality of lighting devices further comprises:

a plurality of headlamps, a recording device configured to capture at least one of still images or videos, one or more sensors configured to determine one or more characteristics of an environment external to an apparatus, a wireless transceiver configured to communicate via one or more wireless networks, and a controller configured to perform the one or more diagnostic tests associated with the rechargeable battery.

19. The method of claim 18, wherein the one or more sensors comprises at least one of a temperature sensor, a humidity sensor, a light sensor, a smoke sensor, a carbon monoxide sensor, a gas sensor, a chemical sensor, or a radiation sensor.

20. The method of claim 16, further comprising determining, based on the respective state of health, whether the respective rechargeable battery satisfies the threshold, wherein the threshold is one of a first threshold, a second threshold, or a third threshold and satisfying the first threshold indicates that the respective rechargeable battery is operating normally, wherein satisfying the second threshold indicates that the respective rechargeable battery should be replaced within a duration, and wherein satisfying the third threshold indicates that the respective rechargeable battery needs to be replaced.

* * * * *